(12) United States Patent
Kellerman et al.

(10) Patent No.: US 6,946,403 B2
(45) Date of Patent: Sep. 20, 2005

(54) METHOD OF MAKING A MEMS ELECTROSTATIC CHUCK

(75) Inventors: Peter L. Kellerman, Essex, MA (US); Shu Qin, Malden, MA (US); Ernie Allen, Rockport, MA (US); Douglas A. Brown, S. Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 55 days.

(21) Appl. No.: 10/695,153

(22) Filed: Oct. 28, 2003

(65) Prior Publication Data

US 2005/0099758 A1 May 12, 2005

(51) Int. Cl.⁷ .............................. H01L 21/469
(52) U.S. Cl. .................... 438/758; 438/761; 438/778; 438/800
(58) Field of Search ................... 438/758, 761, 438/763, 778, 800

(56) References Cited

U.S. PATENT DOCUMENTS

| | | | |
|---|---|---|---|
| 5,103,367 A | 4/1992 | Horwitz et al. | |
| 5,117,121 A | 5/1992 | Watanabe et al. | |
| 5,325,261 A | 6/1994 | Horwitz | |
| 5,444,597 A | 8/1995 | Blake et al. | |
| 5,452,177 A | 9/1995 | Frutiger | |
| 5,583,736 A | 12/1996 | Anderson et al. | |
| 5,810,933 A | 9/1998 | Mountsier et al. | |
| 5,838,529 A | 11/1998 | Shufflebotham et al. | |
| 5,916,689 A | 6/1999 | Collins et al. | |
| 5,958,813 A | 9/1999 | Aida et al. | |
| 5,969,934 A | * 10/1999 | Larsen | 361/234 |
| 6,023,405 A | * 2/2000 | Shamouilian et al. | 361/234 |
| 6,067,222 A | * 5/2000 | Hausmann | 361/234 |
| 6,117,246 A | 9/2000 | Parkhe et al. | |
| 6,149,774 A | 11/2000 | Sun et al. | |
| 6,215,643 B1 | 4/2001 | Nagasaki | |
| 6,236,555 B1 | 5/2001 | Leeser | |
| 6,378,600 B1 | 4/2002 | Moslehi | |
| 6,388,861 B1 | 5/2002 | Frutiger | |

FOREIGN PATENT DOCUMENTS

JP      10-284583 A      10/1998

* cited by examiner

Primary Examiner—Trung Dang
(74) Attorney, Agent, or Firm—Eschweiler & Associates, LLC

(57) ABSTRACT

The present invention is directed to a method of forming a clamping plate for a multi-polar electrostatic chuck. The method comprises forming a first electrically conductive layer over a semiconductor platform and defining a plurality of portions of the first electrically conductive layer which are electrically isolated from one another. A first electrically insulative layer is formed over the first electrically conductive layer, the first electrically insulative layer comprising a top surface having a plurality of MEMS protrusions extending a first distance therefrom. A plurality of poles are furthermore electrically connected to the respective plurality of portions of the first electrically conductive layer, wherein a voltage applied between the plurality of poles is operable to induce an electrostatic force in the clamping plate.

49 Claims, 25 Drawing Sheets

METHOD OF MAKING A MEMS ELECTROSTATIC CHUCK

RELATED APPLICATIONS

This application is related to U.S. application Ser. No. 10/642,939, filed on Aug. 18, 2003, entitled, "MEMS Based Multi-Polar Electrostatic Chuck", and U.S. application Ser. No. 10/657,449, filed on Sep. 8, 2003, entitled, "Clamping and De-clamping Semiconductor Wafers on an Electrostatic Chuck Using Wafer Inertial Confinement by Applying a Single-Phase Square wave AC Clamping Voltage", and U.S. application Ser. No. 10/683,679, filed on Oct. 10, 2003, entitled, "MEMS Based Contact Conductivity Electrostatic Chuck", which are incorporated herein by reference in their entirety.

FIELD OF THE INVENTION

The present invention relates generally to semiconductor processing systems, and more specifically to a method for manufacturing a multi-polar MEMS electrostatic chuck for clamping a substrate and transferring thermal energy associated therewith.

BACKGROUND OF THE INVENTION

Processing of silicon wafers is commonplace in the manufacture of modern microelectronics devices. Such processing, including plasma processing and ion implantation may be performed at low pressures, wherein RF or microwave plasmas, or high-power particle beams are delivered to the wafer, therein producing high temperatures at the wafer during processing. Such high temperatures (e.g., temperatures exceeding 100 C for conventional implants, and up to 400 C for other processes), however, can have deleterious effects on the wafer.

For many processes, precise temperature control is not required, as long as the wafer temperature remains at less than a predetermined limit, such as below 100 C in ion implantation, or less than 400 C in general. Current trends in ion implantation, however, are tending toward high power serial implanters which generally require cooling with heat transfer coefficients HTC>200 mW/cm$^2$C and temperature control within ±5%.

In advanced implant and wafer processing operations, a precise temperature control is typically required, wherein HTC uniformity across a 300 mm wafer, for example, needs to be maintained within 1%. Such processes can have an HTC value, for example, as high as 500 mW/cm$^2$C. It is in meeting these high performance requirements that the current invention is directed.

Wafer temperature control in semiconductor processing has utilized electrostatic chucks (ESCs) for some time. A typical single-polar ESC is illustrated in FIG. 1, wherein the ESC 10 holds the wafer 20 in place by electrostatic force. The wafer 20 is separated from an electrode 30 by an insulating layer 40. A voltage (e.g., illustrated as a +) is applied to the electrode 30 by a voltage source 50. The voltage applied to the electrode produces an electrostatic field (e.g., illustrated as a "−") at the wafer 20 which induces an equal and opposite charge (e.g., illustrated as a +) on the wafer 20. The electrostatic field on the wafer 20 produces an electrostatic force between the wafer and the ESC 10. Consequently, the electrostatic force holds the wafer 20 against the insulating layer 40.

Cooling of the wafer 20 when utilizing ESCs can be provided by contact conductivity between the wafer and the contact surface 60 of the insulating layer 40, wherein the insulating layer may be cooled by cooling water. Conventionally, the cooling of the wafer 20 generally increases with the voltage applied to the ESC. Significantly high voltages, however, can have deleterious effects on the wafer (e.g., a cause of particle generation), and may further have costly power supply and consumption considerations, along with increased failure rates.

In vacuum environments, conventional ESCs utilize a cooling gas between the wafer 20 and the insulating layer 40, wherein a contact surface 60 of the insulating layer 40 comprises a plurality of protuberances (not shown) machined into the insulating layer, therein providing a region for the cooling gas to reside. Typically, a ceramic layer is conventionally machined to form protuberances therein, wherein the protuberances are formed by bead blasting. However, conventionally machining an insulating layer 40 comprised of a ceramic typically has several drawbacks, both in terms of precision, as well as potential particulate concerns caused by the ceramic layer during wafer processing.

Furthermore, it is typically very difficult to obtain a chuck surface flatness (i.e., control a waviness of the surface) of less than 5 microns across a 300 mm workpiece using conventional mechanical machining methods. For example, when the wafer contacts the conventional chuck surface (e.g., a ceramic chuck surface), the wafer 20 does not contact the chuck surface 60 at every location about the chuck surface, leaving gaps (not shown) between the chuck contact surface and the wafer 20. A size of the gap is typically in the range of 5 microns due to variations across the chuck contact surface 60 generally caused by mechanical machining of the chuck surface. Furthermore, the gap width between chuck and wafer surfaces varies due to a waviness of the conventional chuck surface. This gap, is not uniform across wafer, and further varies depending on clamping conditions.

A thickness of the insulating layer 40 between the clamp electrode 30 and the wafer 20 affects a local clamping force, thereby impacting thermal uniformity across the wafer. Conventional manufacturing methods provide poor control over this dimension, however. Non-uniformities in the insulating layer 40 and the physical gap between the clamp 10 and wafer 20 produce potentially large spatial variations in clamping pressure, making precise temperature control difficult. Models and measurements indicate that, conventionally, an average gap width typically varies between 2 microns and 10 microns, depending on the surface and clamping conditions. This relatively large and uncontrollable gap width across the wafer typically results in a lower cooling capability and a non-uniform temperature across the wafer.

Still further, electrical connections to electrodes of the ESCs of the prior art have typically proven to be difficult to form. Conventionally, a wire is soldered beneath the electrodes in a center portion of the electrodes. Such soldering can disadvantageously perturb the heat conduction uniformity across the wafer.

Thus, there is a need in the art for a method of manufacturing an improved electrostatic chuck that provides a uniform HTC which is readily adjustable during processing, as well as a chuck which provides a higher thermal transfer ability in both cooling and heating of the wafer. Furthermore, a need exists for an electrostatic chuck that provides a clamping surface which is operable to significantly limit particulate contamination during wafer processing.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to a method for forming a clamping plate for an electrostatic chuck for heating or cooling a semiconductor substrate. The method comprises forming a first electrically conductive layer over the semiconductor platform, wherein the first electrically conductive layer comprises a plurality of portions electrically isolated from one another. A first electrically insulative layer is formed over the first electrically conductive layer, wherein the first electrically insulative layer comprises a plurality of MEMS protrusions extending a first distance from a top surface of the first electrically insulative layer. A plurality of poles are electrically connected to the respective plurality of portions of the first electrically conductive layer, wherein a voltage may be applied between the plurality of poles in order to induce an electrostatic force between a wafer residing on the plurality of protrusions and the clamping plate. A protective layer, for example, is further formed over the plurality of protrusions.

According to one exemplary aspect of the present invention, a second electrically conductive layer is formed over a bottom surface of the semiconductor platform, wherein the second electrically conductive layer comprises a plurality of portions electrically connected to the respective plurality of portions of the first electrically conductive layer. The first electrically conductive layer and the second electrically conductive layer, for example, are formed concurrently. A plurality of vertical interconnects are formed between the top surface and the bottom surface of the semiconductor platform, wherein the plurality of vertical interconnects electrically connect the first electrically conductive layer and the second electrically conductive layer. For example, the plurality of vertical interconnects comprise a plurality of vias formed through the semiconductor platform or a plurality of sidewall interconnects formed over a sidewall of the semiconductor platform.

According to another exemplary aspect of the present invention, one or more gas distribution grooves are formed in the top surface of the first electrically insulative layer, the first electrically conductive layer, and the semiconductor platform, and one or more gas distribution holes are formed through the first electrically conductive layer, the semiconductor platform, and the second electrically conductive layer, therein fluidly connecting the one or more gas distribution grooves and the one or more gas distribution holes. The one or more gas distribution grooves, for example, are formed after the formation of the plurality of protrusions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
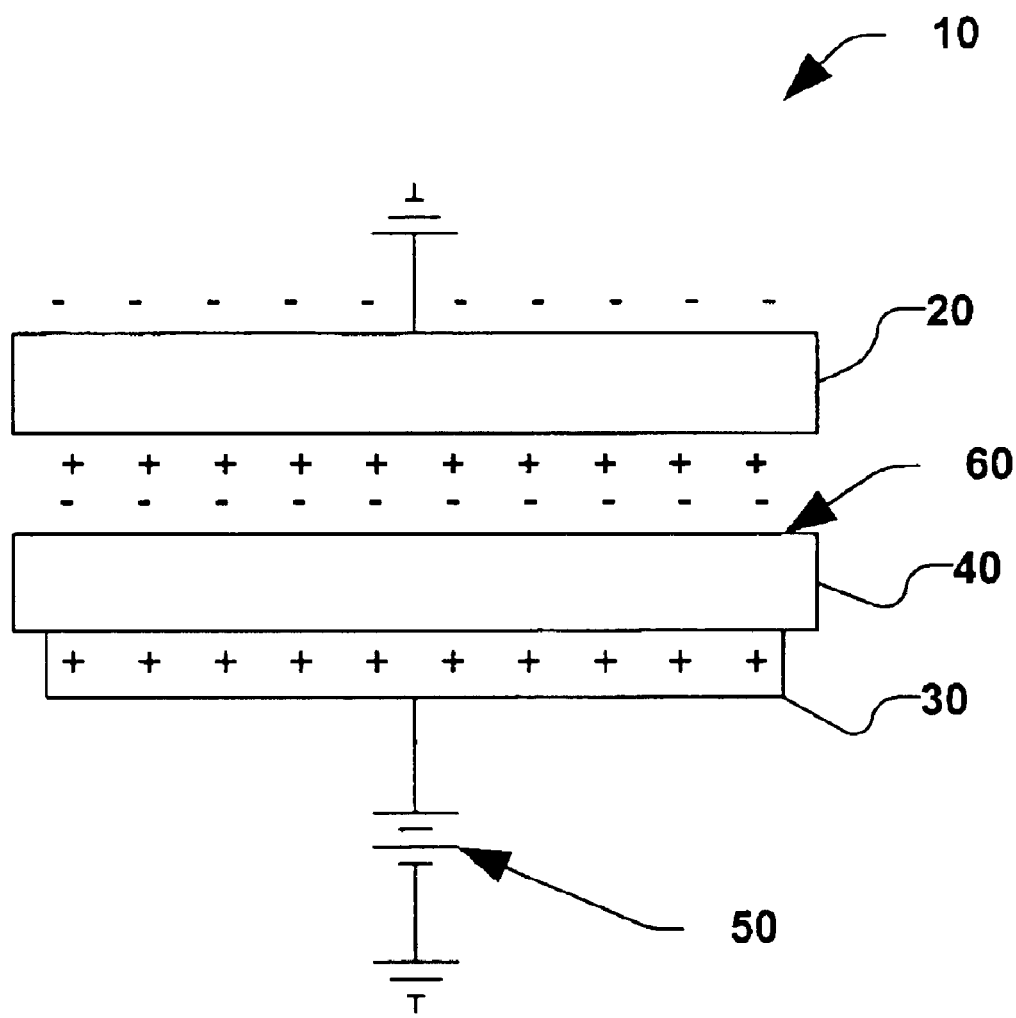
FIG. 1 is a partial cross-sectional view of an exemplary prior art electrostatic chuck.

The present invention is directed towards a multi-polar electrostatic chuck (ESC) and an associated method for forming a clamping plate therefor that incorporates several inventive features thereof. In particular, the electrostatic chuck of the present invention increases an ability to uniformly cool a wafer substrate Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art via a multi-polar electrostatic chuck (ESC) that exhibits a significantly spatially uniform heat transfer coefficient (HTC) between a substrate (e.g., a silicon wafer) and a semiconductor clamping plate associated with the ESC. One approach to obtaining a significantly uniform HTC is to utilize thermal contact conductivity between the substrate and the clamping plate, wherein a voltage applied to the clamping plate generally determines an amount of contact force between the substrate and the clamping plate. HTC uniformity, however, is typically dependent on contact pressure uniformity. One way of maintaining a uniform HTC is to provide a uniform clamping surface. A solid clamping surface, however, generally requires a large contact pressure across the substrate, and thus, a large amount of power applied to the ESC, in order to attain a significantly high HTC. Removing a portion of the clamping surface in accordance with the present invention allows for a reduction in power, while increasing the contact pressure per unit area.

For example, an area of the clamping plate surface is removed, wherein the remaining portions generally define a plurality of protrusions whereon the substrate resides. In accordance with one aspect of the present invention, an area ratio between a contact surface area of the clamping plate and a surface area of the substrate is optimized, wherein a maximum heat transfer can take place through the plurality of protrusions, while minimizing stress to the substrate. A gap is further defined between each of the plurality of protrusions, wherein, in one example, a practical limit to the dimensions of the plurality of protrusions and the gap is contemplated based on backside particles. For example, particles larger than a depth of the gap may cause a failure of the substrate to contact the plurality of protrusions, thereby degrading reliability. Since most particles seen in a typical ESC are less than 1 micron, a lower limit to the depth of the gap, in one example, is approximately 1 micron. Furthermore, in order to minimize stresses in the substrate, a width of the gap (e.g., a distance between protrusions) is approximately equal to a thickness of the substrate.

Another approach to obtaining a significantly uniform HTC is to use backside gas cooling, such that gas conduction between the wafer and the ESC is maintained in a molecular free regime. For example, a gap between the ESC and the wafer is such that the gap is significantly smaller than $\lambda_{mfp}$ (mean free path of a cooling gas). In such a case, the HTC of the cooling gas is substantially independent of the gap, provided the gap remains significantly smaller than $\lambda_{mfp}$. It is thus desirable to make the gap as small as possible.

In a pressure regime afforded by typical ESC clamping forces (which can be up to several hundred Torr), the mean free path of the gas is on the order of 1 micron. This means that the gas conduction is not totally within the molecular free regime, but is generally operating in a transition regime between the molecular free regime and a viscous regime. As a result, there is a moderate variation of HTC with the gap. For example, at 200 Torr, the HTC of an exemplary cooling gas is approximately 500 $mW/cm^2C$, and a 100% variation of the gap (e.g., a gap ranging from 1 micron to 2 microns) will cause approximately a 20% variation in HTC. Therefore, in order to meet a desired 1% temperature uniformity across the wafer, the gap width uniformity should be less than or equal to 5%, in accordance with one aspect of the present invention.

When dealing with backside cooling gases, in addition to gap uniformity, HTC uniformity is typically further dependent on pressure uniformity. A leakage of cooling gas at a perimeter of the wafer typically causes a gas flow, therein introducing a pressure gradient. This problem can be ameliorated by confining a region of gas flow to a region at or near the wafer perimeter. A challenge arises to incorporate gas distribution grooves along with the surface structure that provides a uniform gap in such a way that provides easy and reliable manufacturing as well as avoiding the possibility of discharges.

Another challenge overcome by the present invention is achieving a control of the surface while further allowing the ESC to be multi-polar. Uni-polar clamps (e.g., wherein the entire ESC is one electrode) can be used in applications in which the wafer is exposed to a plasma, wherein a conductive path is created between the wafer and electrical ground. However, in applications wherein the wafer is not in constant contact with a plasma, a minimum of two (2) electrodes is necessary, wherein each electrode has an opposite polarity, thereby allowing the wafer to remain at virtual ground without an electrical connection through the wafer. Thus, a multi-polar electrostatic chuck is introduced by the present invention which comprises precise surface control while allowing multiple electrodes to be incorporated and electrically connected to a power supply.

Figure 2:
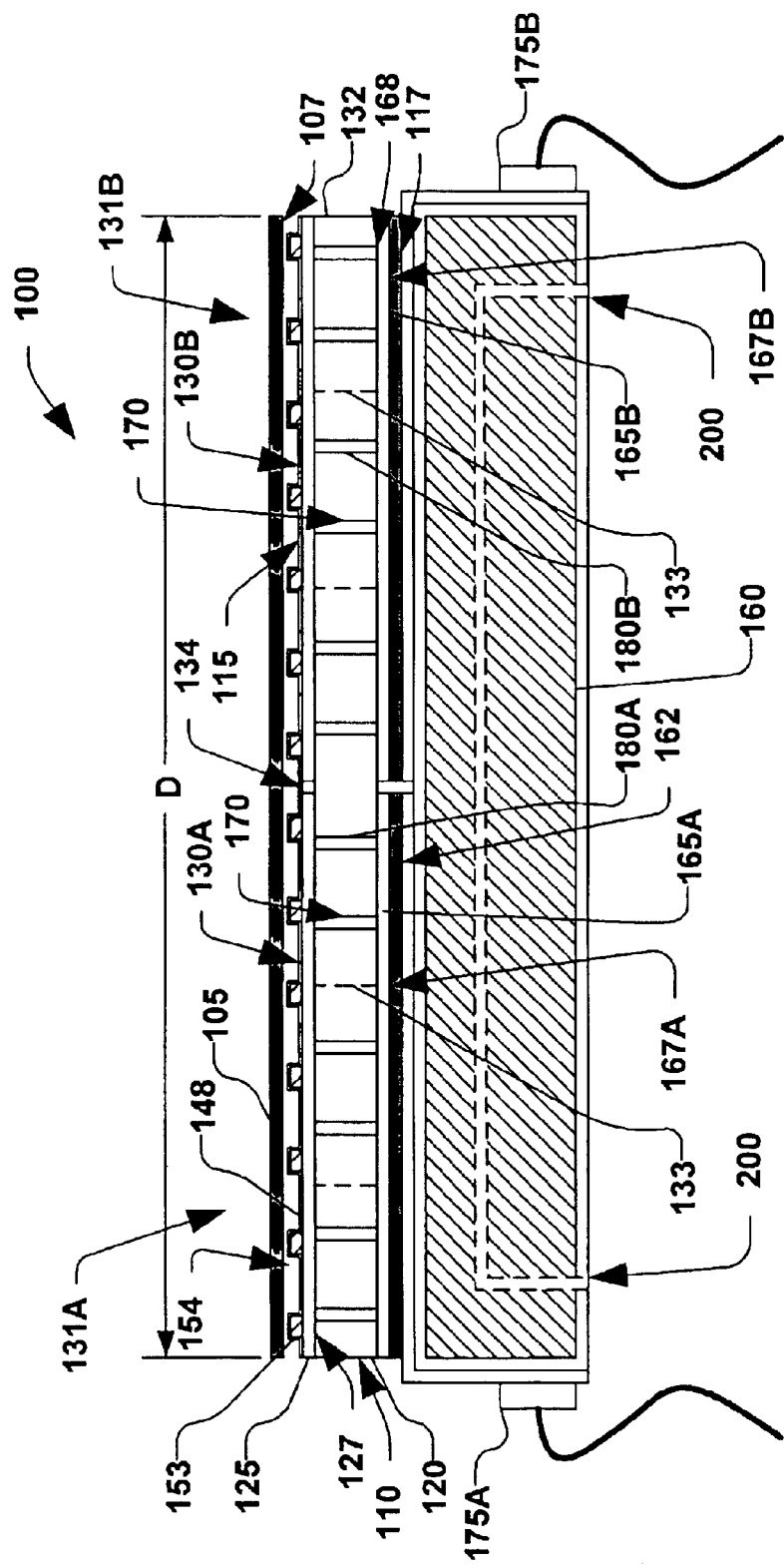
FIG. 2 is a partial cross-sectional view of an electrostatic chuck according to one exemplary aspect of the present invention.

Referring now to the figures, FIG. 2 of the present invention illustrates a cross-sectional view of an exemplary multi-polar ESC 100 according to one aspect of the invention, wherein the ESC is operable to support and process a substrate 105 residing thereon (e.g., heat or cool the substrate). The substrate 105, for example, is generally characterized by a diameter D and a bottom surface 107, wherein the bottom surface has a first surface area (not shown) associated therewith. It should be noted that the electrostatic chuck 100 of FIG. 2 is illustrated macroscopically for simplicity, however, subsequent Figures (e.g., FIGS. 10, 11 and others) are provided which illustrate exemplary alternative views of the electrostatic chuck 100 in further detail.

The electrostatic chuck 100 of FIG. 2 of the present invention comprises a generally planar clamping plate 110 having a top surface 115 associated with the bottom surface 107 of the substrate 105 and an oppositely disposed bottom surface 117. The clamping plate 110, for example, comprises a semiconductor platform 120, wherein a first electrically conductive layer 125 is formed over a top surface 127 of the semiconductor platform. The first electrically conductive layer 125 is comprised of a plurality of portions 130, wherein the plurality of portions are generally electrically isolated from one another, therein defining a plurality of poles 131 of the multi-polar ESC 100, as will be discussed hereafter. The semiconductor platform 120, for example, comprises a semiconductor substrate 132, such as a silicon wafer, wherein the plurality of portions 130 of the first conductive layer 125 formed thereover are generally defined by an isolator region 134 between the plurality of portions 130. The isolator region 134 generally electrically isolates the plurality of portions 130 of the first electrically conductive layer 125 from one another, wherein a voltage applied to the plurality of portions 130 is operable to generate an electrostatic force between the clamping plate 110 and the substrate 105.

According to one exemplary aspect of the present invention, the clamping plate 110 is formed using semiconductor lithographic techniques, as will be described infra, wherein the isolator region 134, for example, is generally masked during the formation of the first electrically conductive layer 125. Alternatively, the isolator region 134 is etched, wherein the first electrically conductive layer is generally removed in the isolator region. The semiconductor platform 120, for example, may be comprised of a single semiconductor substrate 132, or, alternatively, the semiconductor platform may comprise a mosaic of separate semiconductor substrates 132 (e.g., indicated as dashed lines 133), wherein the first electrically conductive layer 125 is further formed over the mosaic of semiconductor substrates. The mosaic of separate semiconductor substrates 132, for example, forms the semiconductor platform 120 by a piecing together of the separate semiconductor substrates to form a generally contiguous semiconductor platform. Such a mosaic, for example, is advantageous for electrostatic chucks requiring a diameter larger than a standard silicon wafer, wherein several semiconductor substrates can be pieced together to form the a larger semiconductor platform 120.

Figure 12:
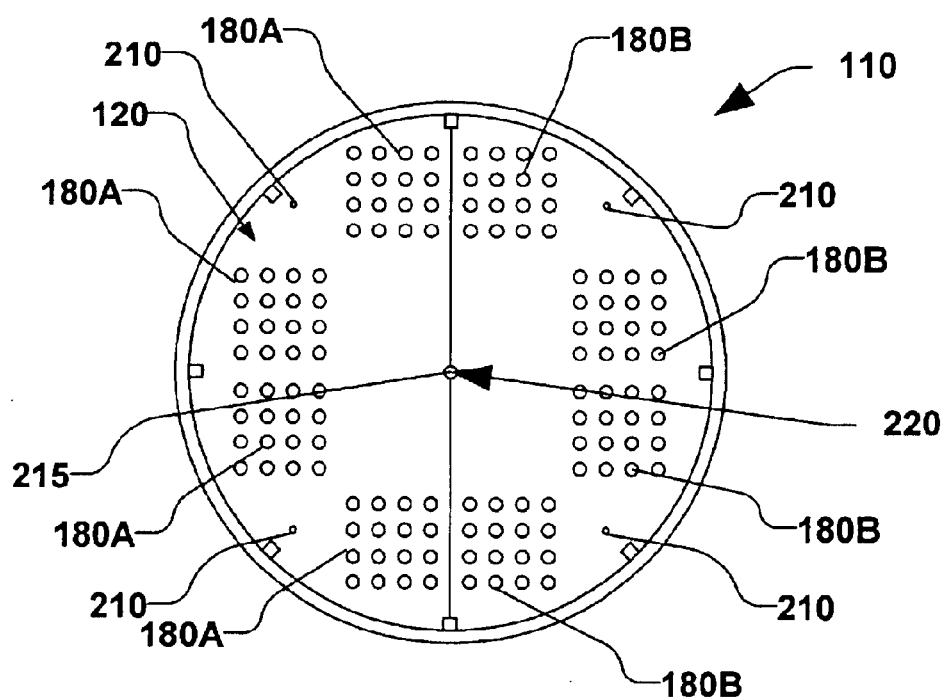
FIG. 12 is a plan view of an exemplary clamping plate comprising a plurality of vias according to the one aspect of the present invention.

In another alternative aspect of the present invention, as illustrated in FIG. 12, the semiconductor platform 120 may be comprised of a plurality of distinct segments 135 formed from separate semiconductor substrates 132, wherein the plurality of portions 130 of the first electrically conductive layer 125 are individually formed over each segment 135. The plurality of segments 135, for example, are separated from one another by an insulative material, such as a ceramic spacer 137, wherein the plurality of portions 130 of the first electrically conductive layer 125 are electrically isolated from one another.

Figure 3:
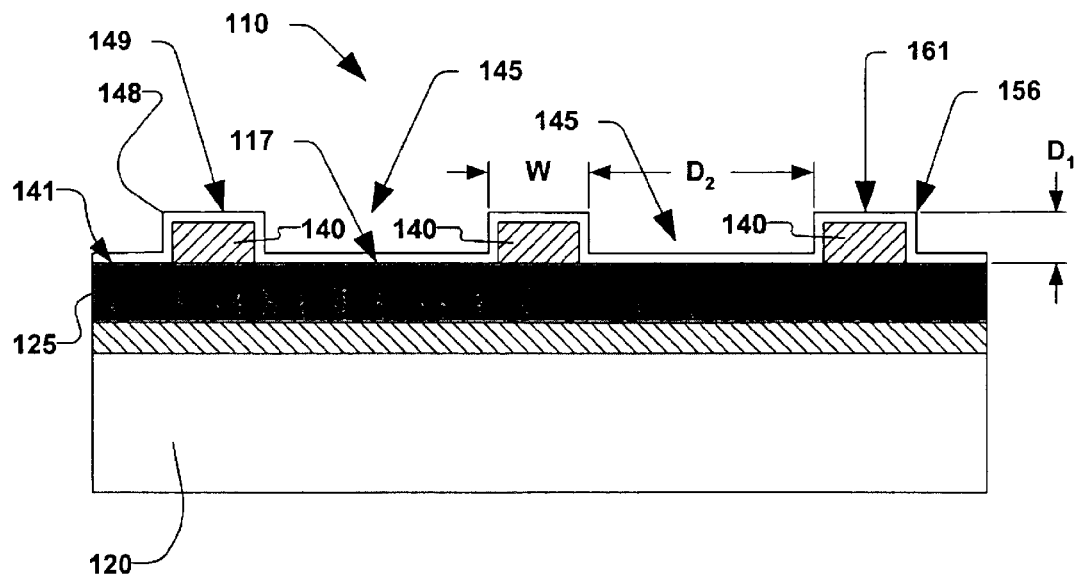
FIG. 3 is a partial cross-sectional view of an exemplary clamping plate having a plurality of protrusions according to an aspect of the present invention.

FIG. 3 illustrates a partial cross sectional view of a portion of the clamping plate 110 of FIG. 2, wherein several exemplary aspects of present invention are illustrated in greater detail. It should be noted that the figures are not necessarily drawn to scale, but rather are provided primarily for purposes of illustration. According to one exemplary aspect of the present invention, the clamping plate 110 further comprises a plurality of electrically insulative protrusions 140 generally extending outwardly from a top surface 141 of the first electrically conductive layer 125 of FIG. 2 (and hence, generally extending outwardly from the top surface 117 of the clamping plate 110). Referring again to FIG. 3, the plurality of protrusions 140 are generally formed over the first electrically conductive layer 125 and extend generally a first distance $D_1$ from the top surface 117 of the clamping plate 110. Accordingly, the plurality of protrusions 140 generally define a plurality of gaps 145 therebetween, wherein the plurality of protrusions, for example, are spaced from one another by a second distance $D_2$, thereby defining a width of the plurality of gaps. The second distance $D_2$ is generally less than a thickness of the substrate (not shown) to be clamped, whereby mechanical deflection of the substrate during clamping is significantly reduced, as will be discussed in greater detail hereafter. For example, the second distance $D_2$, is less than approximately 100 microns.

Figure 4:
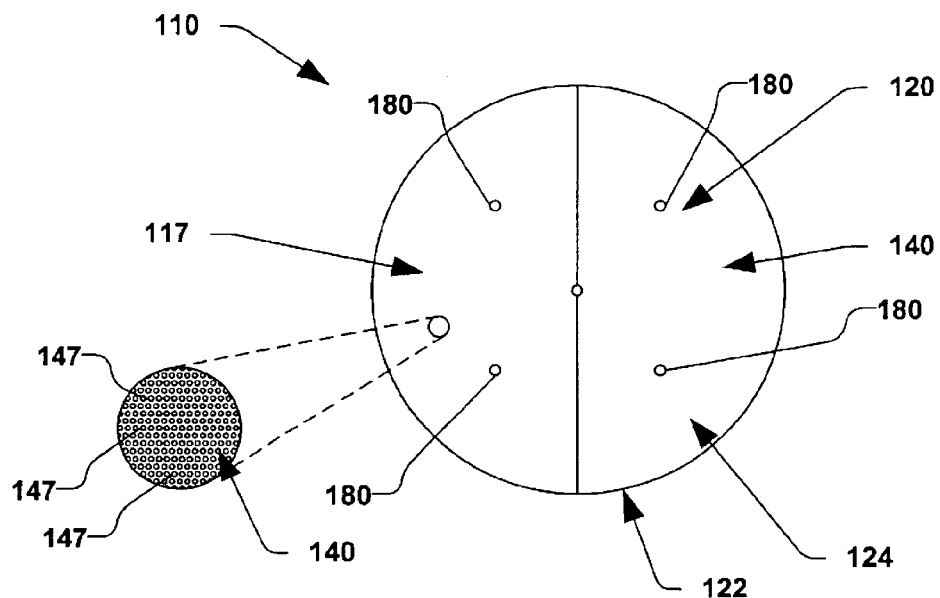
FIG. 4 is a plan view of an exemplary clamping plate comprising a plurality of protrusions according to an aspect of the present invention.

According to yet another exemplary aspect of the present invention, the plurality of protrusions 140 are comprised of microelectromechanical structures (MEMS). For example, the semiconductor platform 120 is comprised of a material which is typically utilized in forming MEMS microstructures, such as silicon, wherein the plurality of protrusions 140, for example, are comprised of silicon dioxide ($SiO_2$) formed thereover. MEMS microstructures generally provide a tightly-controlled and consistent dimensional integrity across the top surface 117 of the clamping plate 110, wherein the plurality of protrusions 140 extend a generally consistent first distance $D_1$ from the top surface across the clamping plate. For example, FIG. 4 illustrates the plurality of protrusions 140 comprising a plurality of substantially cylindrical or rectangular islands 147 which have been formed over the top surface 117 of the clamping plate 110. The plurality of protrusions 140 are operable to generally contact the bottom surface 107 of the substrate 105 illustrated in FIG. 2, thereby defining a protrusion contact area. Preferably, the protrusion contact area ratio (AR) is around 10% of the total of the bottom surface area of the substrate 105 for contact conduction, while the AR is less than about 5% of the total of the bottom surface area of the substrate for thermal conduction through a cooling gas (not shown), as will be discussed hereafter. For example, the plurality of islands 147 of FIG. 3 have a diameter of about 10 microns or less, and are spaced from one another by approximately 25 to 100 microns.

Although the plurality of protrusions 140 extending from the top surface 117 of the clamping plate 110 are illustrated as being of uniform shape and arranged in an ordered manner, other arrangements of the plurality of protrusions are also contemplated, and any shape or order of protrusions or other such alternatives are contemplated as falling within the scope of the present invention. Referring again to FIG. 2, the top surface 127 of the semiconductor platform 120 and the plurality of protrusions 140 may furthermore comprise, for example, a protective coating 148, such as a silicon nitride ($Si_3N_4$) layer, formed thereover. The protective coating 148, as illustrated in FIG. 3, for example, can have a low emissivity, wherein heat emitted from the substrate (not shown) toward the clamping plate 115 is reflected from the protective coating during a heating of the substrate, thereby encouraging thermal conduction to occur primarily through gas conduction in the gaps (when gas conductivity is utilized), as will be discussed in greater detail infra. According to another example, the protective coating 148 provides a substantially hard and inert interface 149 between the clamping plate 110 and the substrate (not shown), wherein the protective coating generally decreases the possibility of contamination from a degradation of the clamping plate. According to yet another example, the protective coating 148 is operable to generally permit the substrate (not shown) to slide laterally over the interface 149 between the clamping plate 110 and the substrate, wherein the protective coating generally conforms to the plurality of the protrusions 140, thereby rounding one or more sharp edges 146A thereof.

Figure 5:
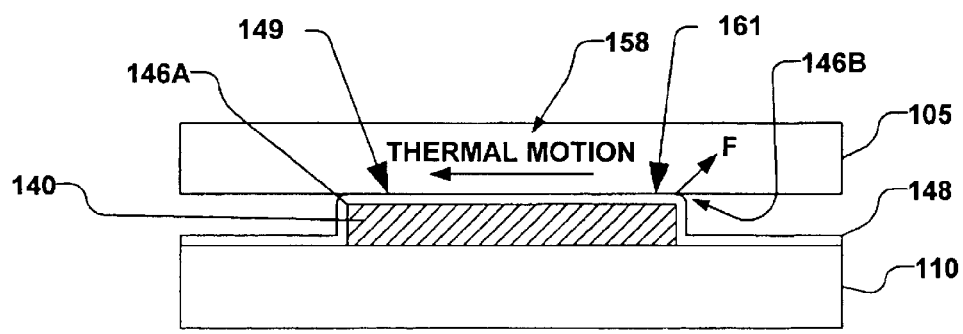
FIG. 5 is a partial cross-sectional view of an exemplary protrusion according to an aspect of the present invention.

FIG. 5 illustrates an exemplary protrusion 140, wherein the protective coating 148 generally conforms to the plurality of the protrusions 140 and has generally rounded the one or more sharp edges 146A, thereby defining one or more rounded edges 146B of the protrusion. As will be appreciated, due to lithography, such rounding may be even more pronounced than that illustrated. The one or more rounded edges 146B, for example, provide advantageous sliding characteristics during a thermal motion (e.g., a thermal expansion or contraction) of the substrate 105 with respect to the clamping plate 110. For example, the thermal motion 158 of the substrate 105 relative to the protrusion 140 can create a force F on the substrate 105 by the protrusion 140. The force F varies depending on, at least in part, the geometry of the protrusion 140. For example, sharp edges 156, as illustrated in FIG. 3, are more likely to create a large force F, wherein the substrate 105 is likely to laterally bind at the sharp edge of the protrusion 140. Stress fractures may appear in the substrate 105, for example, if the force F exceeds the yield strength of the substrate, thereby causing potential contamination and/or damage to the substrate. The rounded edges 146B of FIG. 5 on the other hand, generally limit the force F on the substrate 105 by spreading the force over the rounded edges. Limiting the force F on the substrate 105 generally permits the substrate to more freely expand or contract with respect to the clamping plate 110, thereby generally limiting lateral binding at the protrusion 140.

Referring again to FIG. 3, according to another exemplary aspect of the present invention, the plurality of protrusions 140 are operable to generally maintain the first distance $D_1$ of FIG. 2 from the top surface 117 of the clamping plate to the bottom surface 107 of the substrate 105, wherein the contact conductivity through the plurality of protrusions is uniform across the clamping plate. This is accomplished by tightly controlling the surface roughness of the plurality of protrusions. For example, as illustrated again in FIG. 4, a surface roughness 161 (e.g., a surface finish) of less than 100 Angstroms is attainable for each of the plurality of protrusions 140 through MEMS-based semiconductor processing, wherein the contact conductivity through such a fine surface finish can be significantly controlled, as compared to conventional mechanically machined surfaces of the prior art.

Figure 6:
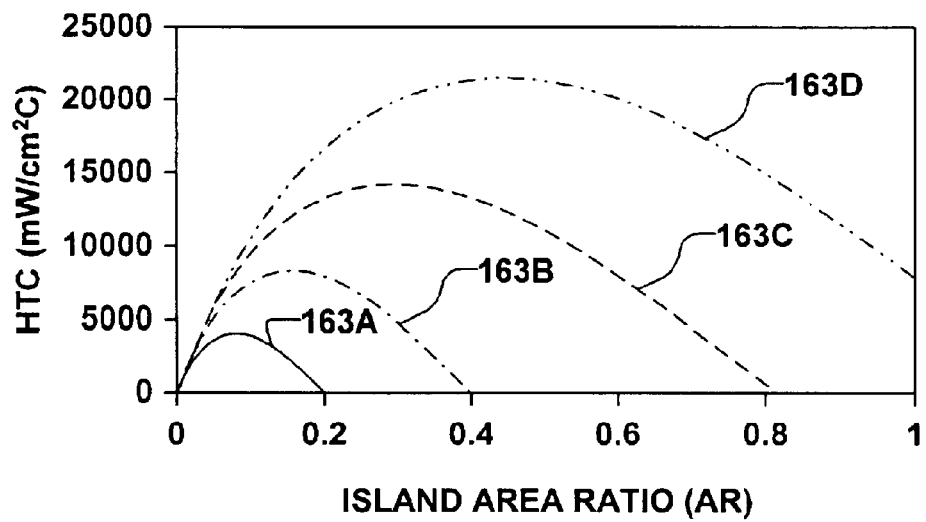
FIG. 6 is a graph illustrating contact heat transfer coefficient and stress on an exemplary clamping plate relative to area ratio according to an aspect of the present invention.

The graph of FIG. 6 illustrates contact heat transfer coefficients for an exemplary MEMS-based electrostatic chuck. Curves 163A–163D illustrate average HTCs at 0.5, 1, 2, and 5 atmospheres of contact pressure, respectively, between the substrate 105 and the plurality of MEMS-based protrusions 140 of FIG. 2. As can be seen, HTC increases rapidly at low ARs, reaches a maximum, and gradually decreases as the AR reaches 100%. Using the data from FIG. 6, the inventors of the present invention appreciated that an optimum AR can be determined for the MEMS-based protrusions 140 for contact conductivity. For example, an AR of approximately 0.1 (10%) is approximately optimum for contact pressures between 0.5 and 1.0 atmospheres for thermal conductance through the protrusions 140. When energy consumption is a concern, it is preferable to maintain the contact pressure below 2 atmospheres, therein defining an optimal AR to a range of less than about 0.2 for optimum contact conduction.

Referring yet again to FIG. 3, according to yet another exemplary aspect of the present invention, the first distance $D_1$ can be further operable to generally permit a flow of a cooling gas (not shown) within the plurality of gaps 145, wherein the electrostatic chuck 100 is operable to transfer heat from the substrate to the clamping plate via thermal conduction in the free molecular regime of the cooling gas. For example, in order to permit thermal conduction in the free molecular regime, the first distance $D_1$ is generally under 5 microns. Preferably, the first distance $D_1$ from the top surface 117 of the clamping plate 110 to the bottom surface 107 the substrate 105 is approximately 1 micron or less for gas conduction.

Figure 7:
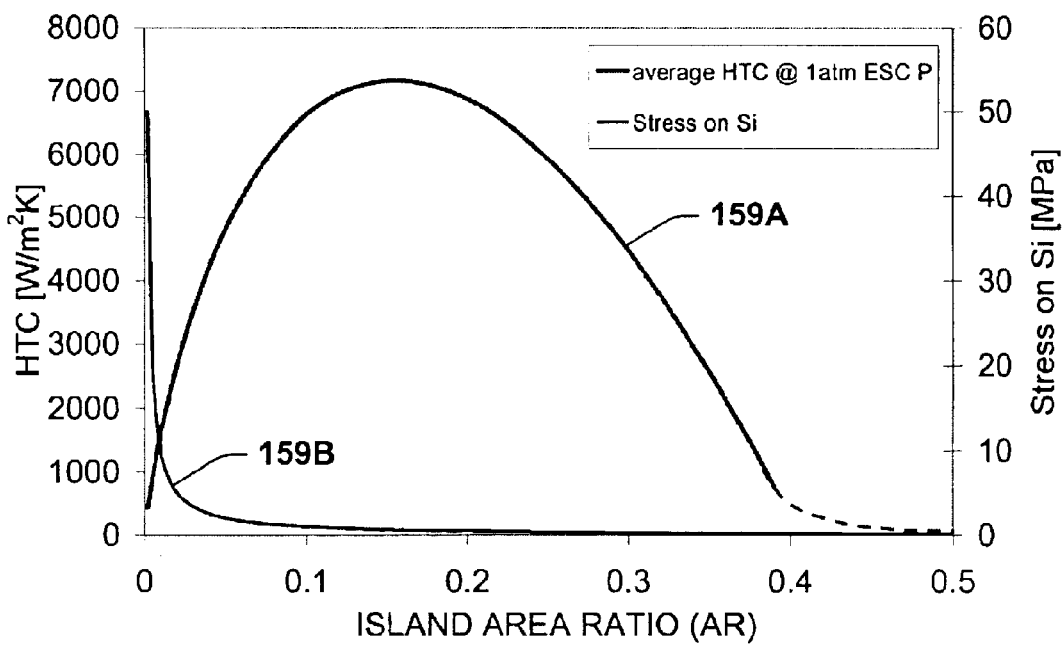
FIG. 7 is a graph illustrating a contact heat transfer coefficient relative to area ratio of an exemplary clamping plate according to an aspect of the present invention.

The above phenomena may be more fully appreciated in conjunction with FIG. 7 which illustrates a graph of the contact HTC and wafer stress for various contact area ratios. For example, at low area contact ratios (e.g., an AR of about 0.05 or less) the contact HTC (graph 159A) is small due to the small contact area between the protrusions and the wafer. While, in one instance, a low contact HTC is desirable (so that thermal conduction is dictated primarily by the thermal conduction of a gas residing between the clamping plate 110 and the substrate 105 of FIG. 2), such small area ratios typically cause the stress (graph 159B of FIG. 6) on the substrate to be undesirably high, especially at high electrostatic chuck pressures. As the contact area ratio increases (e.g., protrusion contact area of all the protrusions being a larger proportion of the entire wafer area), the contact HTC begins to increase, reach a maximum and decrease again, which reflects the trade-offs that occur due to increased area and reduced contact pressure per unit area on the protrusions. In this range (e.g., between an AR of about 0.05 to about 0.3) the contact HTC is relatively high, thereby making switching of a cooling of the ESC via a pressure control of the gas residing between the ESC and the substrate more difficult or less controlled, since the contact HTC is passive and cannot be "turned off" like the gas conduction HTC (e.g., turned off by a change in pressure). At higher contact area ratios, for example, ARs of about 0.4 or more, the stress is negligible and the contact HTC is again substantially low such that the activation/deactivation of cooling is dictated primarily by a cooling gas backside pressure.

Generally, the behavior of a cooling gas heat transfer coefficient (HTC) across a distance between two bodies falls into one of three operating regimes: the viscous regime, the free molecular regime, and the transition regime. In the viscous regime, the heat transfer coefficient (HTC) is a function of the gap distance and the thermal conductivity of the cooling gas, but generally is independent of the cooling gas pressure (hereinafter referred to as backside gas pressure). In the free molecular regime, the HTC is a function of the backside gas pressure and the molecular weight of the cooling gas, but is independent of the gap distance. The free molecular regime is established substantially with the distance (e.g., the first distance $D_1$) less than a few microns (e.g., about 3–5 microns). Furthermore, the transition regime is characterized by a smooth interpolation between the viscous regime and the molecular regime.

Conduction of heat through a gas in the free molecular regime, as defined by the present invention, provides for several unique advantages. For example, by maintaining the gap (e.g., the distance $D_1$) on the order of the mean free path of the cooling gas, cooling across the wafer is substantially insensitive to the gap distance and instead is primarily a function of the backside pressure, thereby leading to cooling uniformity spatially across the wafer, despite slight variations in the gap (e.g., due to wafer deformation or particulates). In addition, since the gap distance is small, the volume associated therewith is also small, thereby allowing a cooling of the wafer to be effectuated extremely quickly by altering the backside pressure. Thus the present invention allows one to quickly cool the wafer once a spike anneal temperature is reached.

Figure 8:
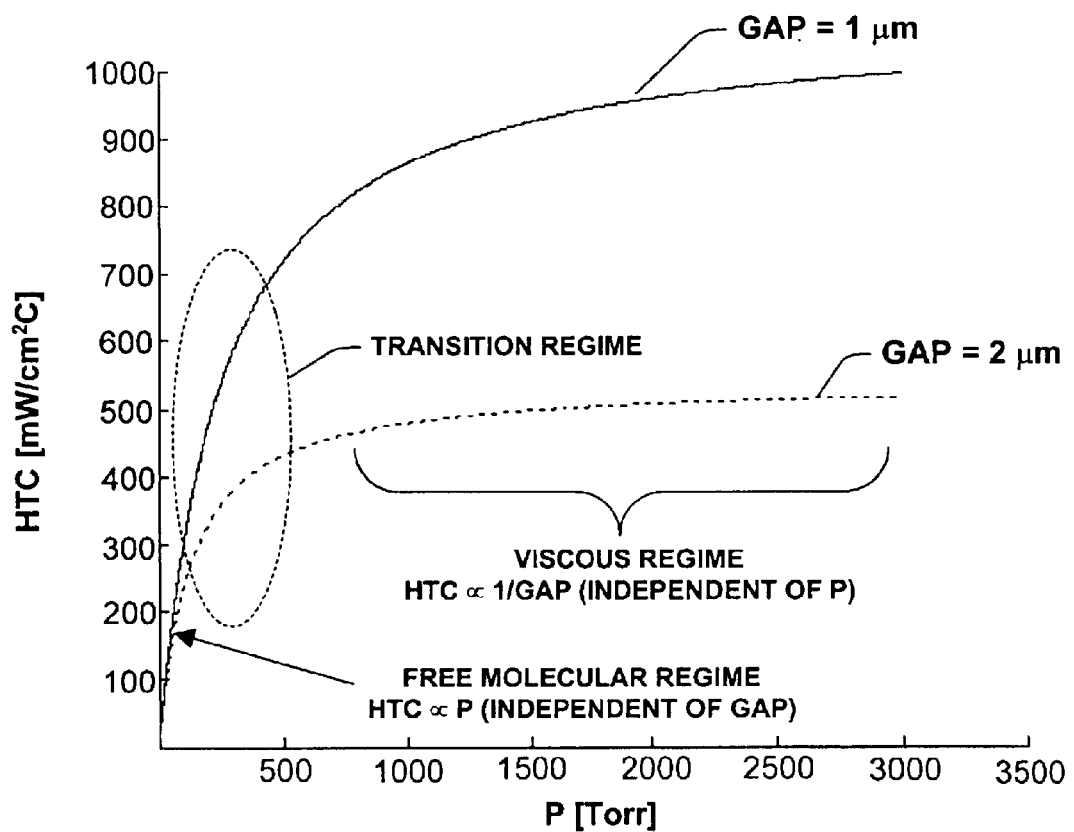
FIG. 8 is a graph illustrating an exemplary heat transfer coefficient of a gas in the molecular and viscous regimes according to an aspect of the present invention.

FIG. 8 is a graph that illustrates the behavior of the HTC versus backside gas pressure for nitrogen at first distances $D_1$ of 1 and 2 microns. The free molecular regime, in which the HTC is predominantly a function of backside gas pressure, is seen for gas pressures in the present example in the range of 0 to about 250 Torr when the first distance $D_1$ is 1 micron, or when the first distance $D_1$ is less than the mean free path (MFP) of the cooling gas. The viscous regime, in which the HTC is a primarily a function of the first distance $D_1$, is seen for backside gas pressures greater than approximately 250 Torr, or when the first distance $D_1$ is greater than the mean free path (MFP) of the cooling gas (not illustrated in the present figure). Between these two regimes, the transition regime is seen.

FIG. 8 further illustrates that in the free molecular regime, the cooling gas HTC may be controlled primarily by adjusting the backside gas pressure; however, the first distance $D_1$ still plays a role in the HTC at higher pressures. For example, for a first distance $D_1$ of 2 microns as compared to 1 micron, the thermal conductivity of the cooling gas begins transitioning from the free molecular regime to the viscous regime at approximately 250–275 Torr. Therefore, first distance $D_1$ uniformity is still a concern when varying pressures from atmospheric pressure to substantial vacuum pressures (e.g., less than 20 Torr). However, by controlling the pressure between substantial vacuum and about 250 Torr the HTC can be controlled primarily by the backside pressure independent of slight variations in the gap distance. Therefore cooling uniformity across the wafer is maintained.

Figure 9:
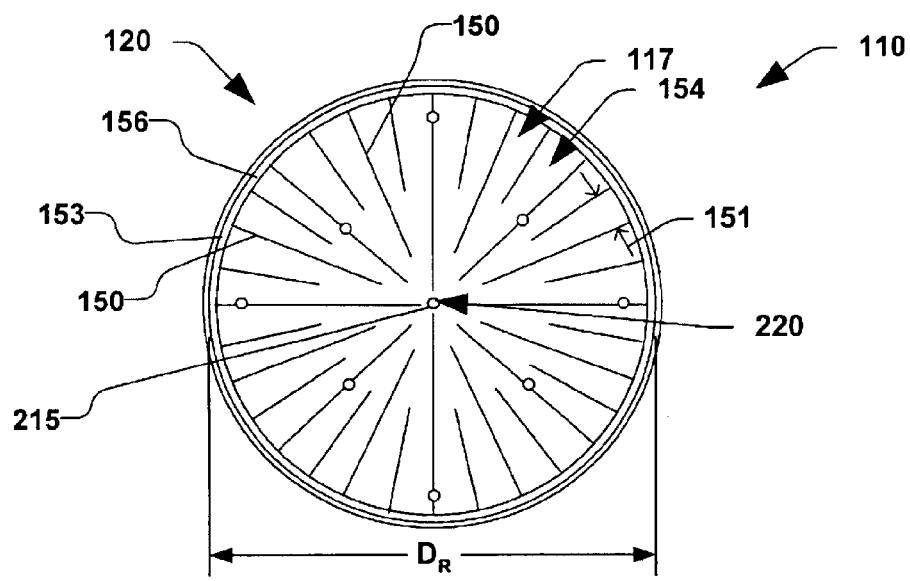
FIG. 9 is a plan view of an exemplary clamping plate comprising a plurality of gas distribution grooves according to one aspect of the present invention.
Figure 10:
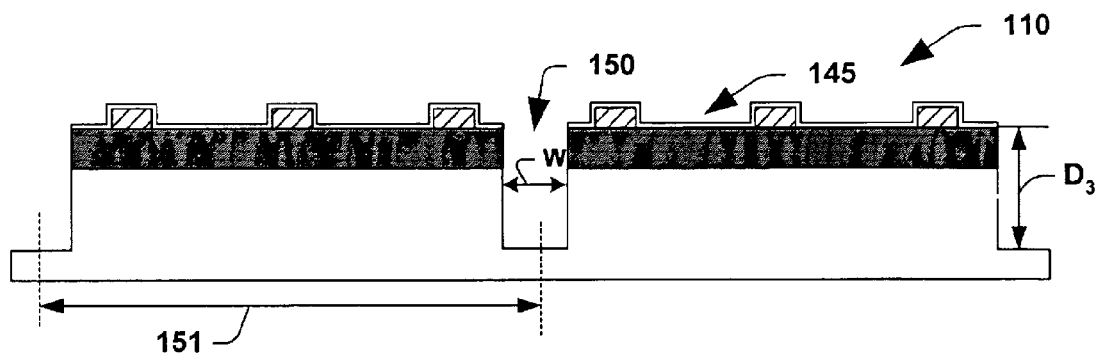
FIG. 10 is a partial cross-sectional view of an exemplary clamping plate illustrating gas distribution grooves.

According to yet another exemplary aspect of the present invention, as illustrated in FIG. 9, the clamping plate 110 comprises one or more gas distribution grooves 150, wherein the gas distribution grooves are adapted to allow the cooling gas (not shown) to flow therethrough, and wherein an adjustment to the pressure of the cooling gas (the backside pressure) can be quickly attained. As illustrated in FIG. 10, the gas distribution grooves 150 generally extend a third distance $D_3$ into the clamping plate 110, wherein each gas distribution groove intersects at least one of the plurality of gaps 145 of FIG. 2 associated with the clamping plate. The third distance $D_3$, for example, is less than approximately 100 microns, wherein the flow of the cooling gas within the gas distribution grooves 150 falls into the viscous regime. Furthermore, a significantly larger third distance $D_3$ of the gas distribution groove (compared to the gap 145) generally permits a fast response time for pumping the cooling gas from the clamping plate 110.

The gas distribution groove 150 is further characterized by a width W generally coplanar with the top surface 117 of the clamping plate 110. The width W of the gas distribution groove 150 is preferably less than 100 microns, or the thickness (not shown) of the substrate 105 residing on the clamping plate 110, such that thermal conduction is substantially uniform across the bottom surface 107 of the substrate, for reasons similar to those discussed above. According to another exemplary aspect, the width of each gas distribution groove 150 is approximately equal to the third distance $D_3$.

By having gas distribution grooves 150 that are substantially large (e.g., compared to the gaps 145 between the protrusions 140), gas flow therethrough is in the viscous regime that is about 50 times greater than the flow rate in the free molecular regime for a given pressure. The fast flow rate of cooling gas through the gas distribution grooves 150 facilitates a fast turn-on for cooling of the substrate. Nevertheless, the total surface area of the grooves is very small compared to a contact area of the gas to the wafer in the plurality of gaps 145. In this respect, FIG. 10 is not drawn to scale (but is instead provided for purposes of illustration), rather the number of gaps 145 between the grooves 150 is quite substantial. For example, for a groove distance 151 of less than about 1 cm, and the protrusions 140 having a diameter of about 10 microns or less, approximately 90 protrusions or more may reside between the grooves.

Figure 11:
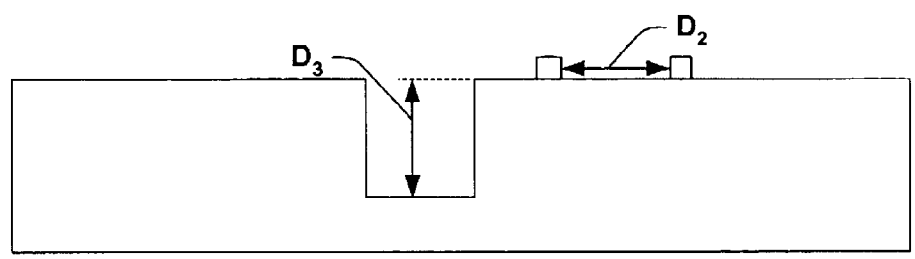
FIG. 11 is a simplified partial cross-section view of an exemplary clamping plate illustrating an exemplary relationship between groove depth and protrusion distance according to one aspect of the present invention.

Accordingly, the plurality of gas distribution grooves 150 are provided, wherein the plurality of gas distribution grooves are operable to significantly decrease a response time for pumping the cooling gas from the clamping plate 110. For example, as illustrated in FIG. 9, the plurality of gas distribution grooves 150 may radiate generally outwardly from a center 152 of the clamping plate 110, wherein the plurality of gas distribution grooves are patterned such that any location on the top surface 117 of the clamping plate is within about 5 mm from at least one of the plurality of gas distribution grooves. Preferably, the distance 151 between the grooves is less than about 1 cm. Although the plurality of gas distribution grooves 150 are illustrated as radially extending grooves, it should be understood that the grooves may be configured in numerous ways, and in varying numbers, and such variations are contemplated as falling within the scope of the present invention. Further, as illustrated in the example of FIG. 11, a depth $D_3$ of the grooves 150 is approximately the same as a distance $D_2$ between the various protrusions 140.

The cooling gas, for example, comprises one or more of substantially thermally conductive gases, such as oxygen, hydrogen, helium, argon, and nitrogen, wherein the cooling gas is generally supplied to an environment (not shown) such as a process chamber (not shown) containing the electrostatic chuck 100 of FIG. 2. Therefore, the cooling gas is pumped from the environment (e.g., from within the process chamber (not shown)) through the electrostatic chuck 100, and out to an appropriate pump (not shown). According to another exemplary aspect of the invention, referring again to FIG. 9, one of the plurality of protrusions comprises a ring 153 which is generally coaxial with the substrate 105. The diameter $D_R$ of the ring 153, for example, is slightly smaller than the diameter D of the substrate 105 illustrated in FIG. 2, wherein the ring is operable to generally enclose an inner portion 154 of the substrate and the clamping plate 115, generally forming a seal between the inner portion and the environment 155. Referring again to FIG. 9, according to another example, a peripheral gas distribution groove 156 resides within the ring 153, wherein the peripheral gas distribution groove generally connects the plurality of distribution grooves 150.

According to still another exemplary aspect of the invention, the exemplary electrostatic chuck 100, as illustrated in FIG. 2, further comprises a base plate 160 operable to transfer thermal energy from the substrate 105 and the clamping plate 110. The base plate 160, for example, is generally characterized by a top surface 162 associated with the bottom surface 117 of the clamping plate 110. The top surface 162 of the base plate 160, for example, generally faces the bottom surface 117 of the clamping plate 110, wherein the base plate and the clamping plate are thermally coupled to one another. The base plate 160, for example, is comprised of a material that provides good thermal conductivity, such as a metal. Exemplary base plate 160 metals are aluminum, copper, or other metal alloys with good thermal conductivity. Alternatively, the base plate 160 may be comprised of a material having a thermal conductivity similar to a thermal conductivity of the clamping plate 110, such as amorphous silicon (a-Si) or silicon carbide (SiC), wherein a third electrically conductive layer (not shown) is formed According to another exemplary aspect of the present invention, the clamping plate 110 further comprises a second electrically conductive layer 165, wherein the second electrically conductive layer further comprises a plurality of portions 167 electrically isolated from one another. The plurality of portions 167 of the second electrically conductive layer 165 electrically connect to the respective plurality of portions 130 of the first electrically conductive layer 125. The plurality of portions 167 of the second electrically conductive layer 165, for example, generally reside between a bottom surface 168 of the semiconductor platform 120 and the top surface 162 of the base plate 160. According to one example, the plurality of portions 167 of the second electrically conductive layer 165 are formed over the bottom surface 168 of the semiconductor platform 120 during the formation of the first conductive layer 125 over the top surface 127 of semiconductor platform 120.

According to still another exemplary aspect of the present invention, the second electrically conductive layer 165 further comprises a plurality of electrically conductive vertical interconnects 170. The vertical interconnects 170, for example, electrically connect the first electrically conductive layer 125 and the second electrically conductive layer 145. A plurality of electrodes 175, for example, are further electrically connected to the second electrically conductive layer 165, therein electrically connecting the first electrically conductive layer 125 to the plurality of electrodes via the plurality of vertical interconnects 170. The plurality of vertical interconnects 170 may comprise, for example, a plurality of vias 180 associated with the semiconductor platform 120, wherein the plurality of vias generally extend from the top surface 127 to the bottom surface 168 of the semiconductor platform. The plurality of vias 180, therefore, electrically connect each portion 130 of the first electrically conductive layer 125 to the respective portion 167 of the second electrically conductive layer 165. Each portion 130 and 167 of the first electrically conductive layer 125 and second electrically conductive layer 165, respectively, may be electrically connected, for example, by one or more of the plurality of vias 180 (e.g., portion 130A is electrically connected to portion 167A through one or more vias 180A). As Illustrated in FIG. 12, for example, the plurality of vias 180 are generally oriented about the semiconductor platform 120 such that the clamping plate 110 is substantially thermally and electrically balanced.

Figure 13:
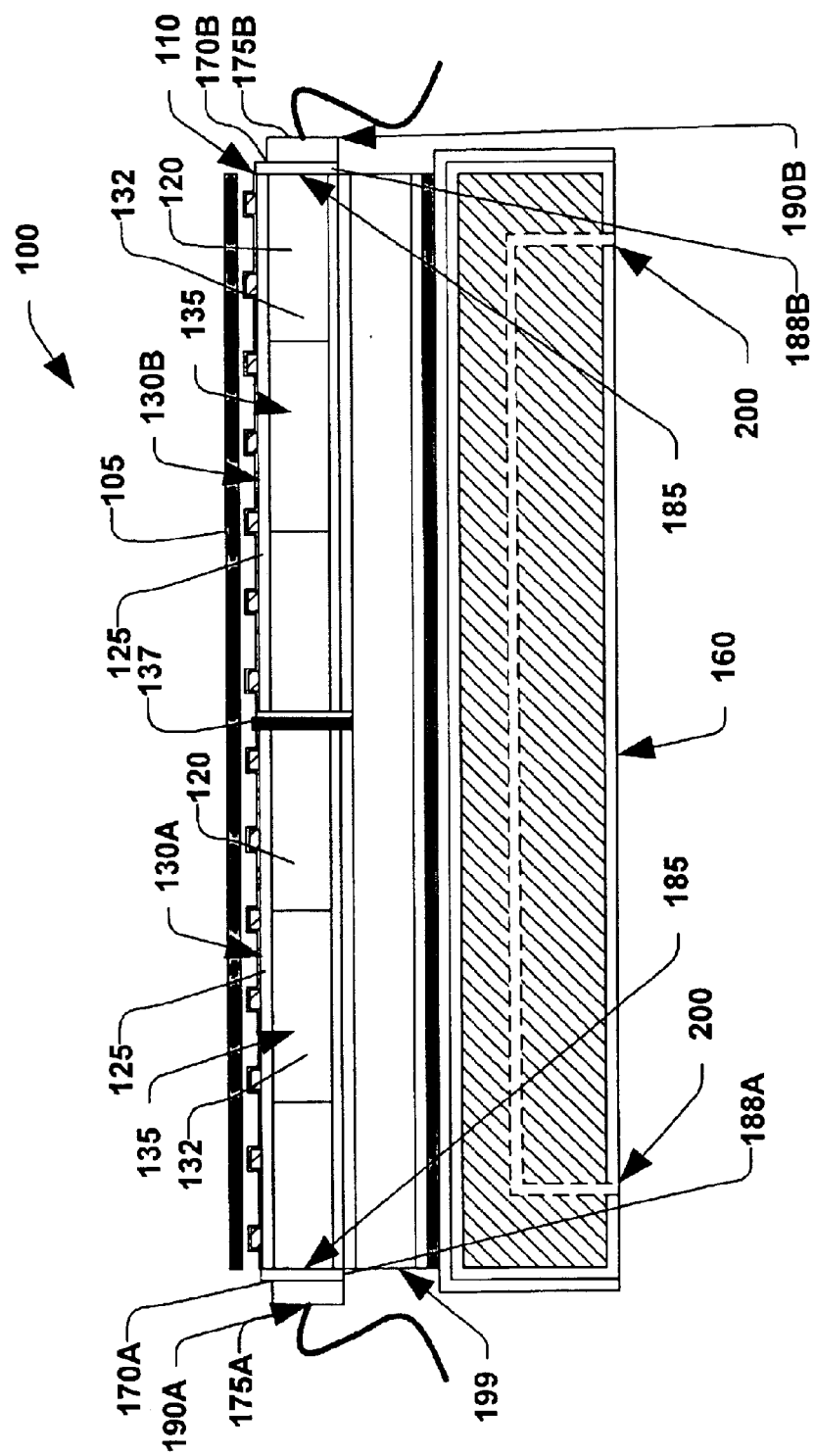
FIG. 13 is a partial cross-sectional view of an electrostatic chuck according to another exemplary aspect of the present invention.

According to another example, FIG. 13 illustrates another exemplary ESC 100, wherein the plurality of vertical interconnects 170 are associated with a sidewall 185 of the semiconductor platform 120, therein defining a plurality of sidewall interconnects 188. Each portion 130 of the first electrically conductive layer 125, for example, is electrically connected to a respective sidewall interconnect 188, wherein each sidewall interconnect may be electrically connected to the respective electrode 175. For example, each respective electrode 175 comprises a spring-forced sidewall contact electrode 190, wherein the spring-forced sidewall contact electrodes are mechanically compressed against the respective sidewall interconnects 188 by a spring force (not shown), wherein physical bonding (e.g., brazing or epoxy bonding) of the electrodes to the sidewall interconnects is not necessary.

Figure 14:
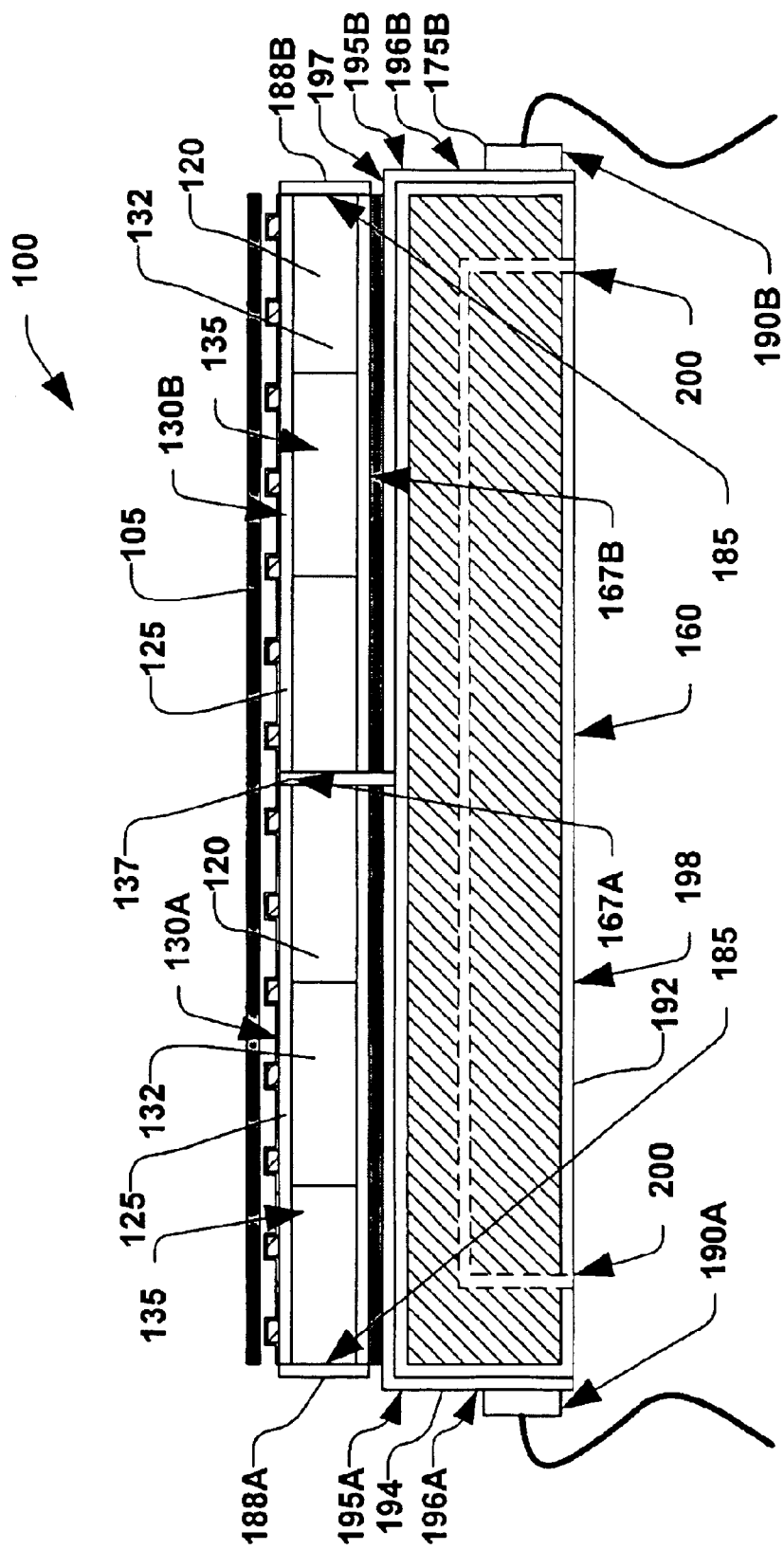
FIG. 14 is a partial cross-sectional view of an electrostatic chuck according to still another exemplary aspect of the present invention.

According to another exemplary aspect of the present invention, as illustrated in FIG. 14, the base plate 160 comprises a first electrically insulative layer 192 and a third electrically conductive layer 194 is formed thereover. The first electrically insulative layer 192 (e.g., an oxide) generally resides between the base plate 160 and the third electrically conductive layer 194. The third electrically conductive layer 194, for example, further comprises a plurality of portions 195 associated with the respective plurality of portions 130 and 167 of the first electrically conductive layer 125 and the second electrically conductive layer 165, respectively, wherein each portion 195 of the third electrically conductive layer 194 is electrically connected to the respective portion 167 of the second electrically conductive layer. The plurality of portions 195 of the third electrically conductive layer 194 are further electrically isolated from one another, therein keeping the poles of the ESC 100 electrically isolated. For example, the third electrically conductive layer 194 generally resides along a sidewall 196 and a top surface 197 of the base plate 160 (e.g., over the first insulative layer 192), wherein the plurality of electrodes 175 are electrically connected to the third electrically conductive layer at the sidewall of the base plate. Alternatively, the third electrically conductive layer 194 may further be formed over a bottom surface 198 of the base plate 160, wherein the plurality of electrodes 175 may be electrically connected to the third electrically conductive layer at the bottom surface of the base plate.

The third electrically conductive layer 194, for example, generally permits a bonding of the base plate 160 to the clamping plate 110, wherein the base plate can be thermally coupled to the clamping plate, and can be electrically connected to the second electrically conductive layer 165. One exemplary method of coupling the base plate 160 to the bottom surface 117 of the clamping plate 110 is accomplished by brazing, wherein the bottom surface 117 of the clamping plate is metallized (e.g., by the second electrically conductive layer 165) and then vacuum brazed to the top surface 162 of the base plate. For example, the third electrically conductive layer 194 is formed over the top surface 162 of the base plate 160, wherein the second and third electrically conductive layers 165 and 194 are vacuum brazed together. The second and third electrically conductive layers 165 and 194, for example, are comprised of one or more of tungsten silicide, tungsten, or titanium, however any electrically conductive material is contemplated as falling within the scope of the present invention.

According to another exemplary aspect of the invention, referring again to FIG. 13, an electrically insulative intermediate plate 199 resides between the base plate 160 and the clamping plate 110. The intermediate plate 199, for example, comprises an aluminum nitride insulator wafer, wherein the intermediate plate generally electrically insulates the clamping plate 110 from the base plate 160, and still provides adequate thermal conductance. Furthermore, the intermediate plate 199 may be vacuum-brazed to the base plate 160 and the clamping plate 110.

Referring again to FIG. 2, the base plate 160, for example, further comprises one or more first fluid conduits 200, wherein the one or more first fluid conduits are operable to generally permit a cooling fluid (not shown), such as water, to flow therethough, wherein the base plate is substantially cooled by the cooling fluid. As illustrated in FIG. 17Q, the base plate 450 may be electrically conductive and further comprise a plurality of poles 448, wherein the plurality of poles are electrically connected to the respective plurality of portions of the second electrically conductive layer 430, as will be discussed hereafter.

Referring again to FIG. 12, according to another exemplary aspect of the invention, a plurality of lift pins 210 are operatively coupled to the clamping plate 110, wherein the plurality of lift pins 210 are operable to vertically translate the substrate 105 between a processing position (not shown) proximate to the clamping plate 110 and a loading position (not shown) generally above the clamping plate (e.g., approximately 1–2 mm above the clamping plate). The lift pins 210, for example, are comprised of quartz, silicon carbide, or a ceramic material, wherein contamination of the substrate 105 from the lift pins during processing is minimized.

According to still another exemplary aspect of the present invention, the electrostatic chuck 100 further comprises a temperature sensor 215 operable to measure one or more temperatures T associated with the substrate 105 of FIG. 2. For example, the temperature sensor 215 of FIG. 12 comprises a pyrometer, wherein the pyrometer measures the temperature T of the substrate (not shown) through an opening 220 in the top surface 117 of the clamping plate 110. The temperature sensor 215 may comprise, for example, a pyrometer having a minimal volume cavity, wherein the opening 220 through which the pyrometer measures the temperature T of the substrate 105 is small. Minimizing the volume of the opening is advantageous, wherein temperature uniformity can be maintained. Alternatively, the temperature sensor 215 may comprise an optical pyrometer that may furthermore utilize fiber optic rods (not shown) inserted into the clamping plate 110 such that the fiber optic rod, for example, occupies the minimal volume cavity.

Figure 15:
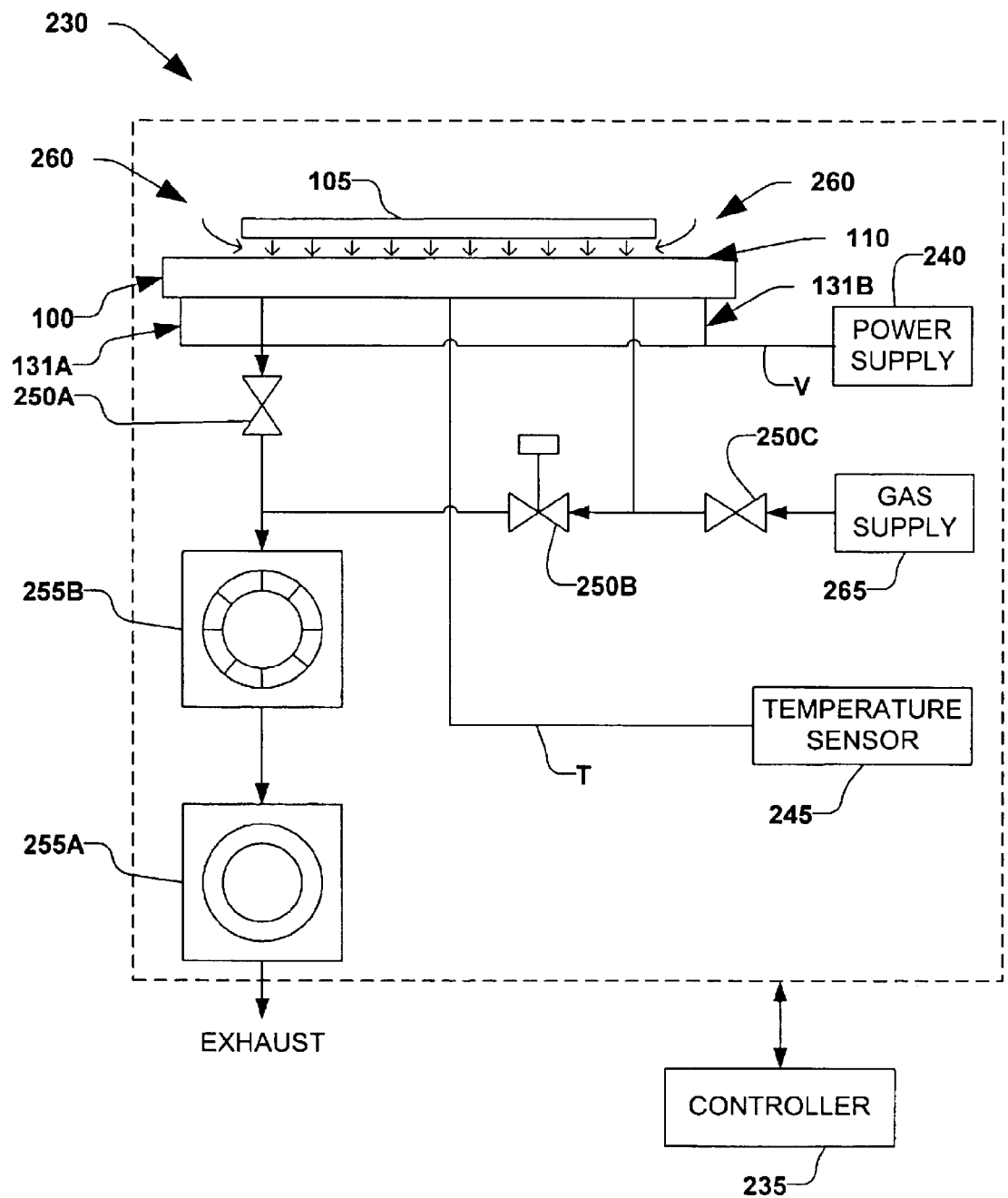
FIG. 15 is a system-level block diagram of an exemplary electrostatic chuck according to an aspect of the present invention.

Referring now to FIG. 15, a block diagram of the electrostatic chuck 100 and a related system 230 is illustrated according to several aspects of the invention. According to one exemplary aspect of the present invention, the system 230 for controlling the electrostatic chuck 100 comprises a controller 235 operatively coupled to a voltage supply 240. The controller 235 is operable to control the voltage V supplied to the poles 131 of the ESC 100 by controlling the voltage supply 240, wherein the voltage is proportional to an amount of clamping force seen by the substrate 105 due to electrostatic forces induced by the voltage. According to one example, the controller 235 can further control an amount of contact HTC of the ESC 100 by increasing or decreasing the voltage V, whereby the electrostatic force, and hence the clamping force, is respectively increased or decreased. As illustrated again in FIG. 3, with a first distance $D_1$ of approximately 1 micron, the voltage V can be maintained well below a breakdown voltage associated with the semiconductor platform (e.g., a voltage of less than approximately 100 V–150 V), while still providing good thermal contact conductivity between the plurality of protrusions 140 and the substrate 105.

According to the above example, controlling the voltage V applied to the electrostatic chuck 100 of FIG. 15 advantageously controls the amount of thermal conduction through the clamping plate. For example, with an area ratio of approximately 0.10 (10%), a low voltage (e.g., less than 20 volts) can be applied to the ESC 100, wherein low contact pressures of less than about 100 Torr can be maintained between the substrate 105 and the clamping plate 110. At the low contact pressure, the substrate 105 is still clamped or secured, but a minimal amount of thermal energy is transferred between the substrate and the electrostatic chuck 100, wherein a thermal portion of the chuck is substantially "off". When the larger voltage V (e.g., approximately 100 volts) is applied to the ESC 100, the contact pressure between the substrate 105 and the clamping plate 110 is substantially increased (e.g., increased to approximately 1–2 atmospheres), thereby quickly increasing the HTC between the substrate 105 and the clamping plate 110 (e.g., an increase of approximately 500 mW/cm²C), and thus effectively turning the thermal portion of the chuck "on" for heating or cooling the substrate. Furthermore, according to another example, providing the first distance $D_1$ of FIG. 3 of approximately 1 micron is advantageous, wherein a thermal resistance between the substrate 105 and the clamping plate 110 is minimized, thereby decreasing heat loss effects. It should be noted, however, that other values for the first distance $D_1$ are contemplated as falling within the scope of the present invention.

The controller 235, in this example, is operable to control the contact pressure by quickly controlling the voltage V applied to the ESC 100, thereby allowing the ESC to quickly change states (e.g., from a heating condition to a cooling condition). The controller 235, for example, is further operable to feed back wafer temperature data T from a temperature sensor 245 associated with the ESC, wherein the voltage supply 240 can be controlled in a closed-loop feedback arrangement. Alternatively, the controller 235 is operable to generally limit the HTC between the substrate 105 and the ESC 100 when a predetermined temperature is reached.

According to another exemplary aspect of the invention, the system 230 of FIG. 15 further comprises one or more valves 250, wherein the one or more valves are operable to selectively permit one or more vacuum pumps 255 to pump the cooling gas 260 through the electrostatic chuck 100 in various modes for gas thermal conductance between the substrate 105 and the ESC. The one or more valves 250, for example, comprise one or more automatic valves (e.g., valve 250A) such as fast-acting solenoid valves or poppet valves, wherein, in one example, the one or more automatic valves have a response time of less than about 20 ms. Such a fast response time is advantageous, since the vacuum applied to the electrostatic chuck 100 can be quickly applied.

According to another exemplary aspect of the present invention, the controller 235 is operatively coupled to the one or more vacuum pumps 255A–255B, a gas supply 265, the voltage supply 240, and the one or more valves 250A–250C. Controlling the vacuum applied to the electrostatic chuck 100 in the present example advantageously controls an amount of thermal conduction through the cooling gas. For example, at low pressures less than about 250 Torr and a gap distance $D_1$ of FIG. 3 of less than about 5 microns, the HTC is dictated primarily by gas pressure. Therefore the valve 250A that controls the backside pressure allows the electrostatic chuck 100 to quickly change states (e.g., from a heating condition to a cooling condition). The controller 235, therefore, is further operable to control a gas pressure between the substrate 105 and the electrostatic chuck 100 via controlling the one or more automatic valves 250.

The present invention is also directed toward a method for forming a semiconductor-based multi-polar electrostatic chuck. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 16:
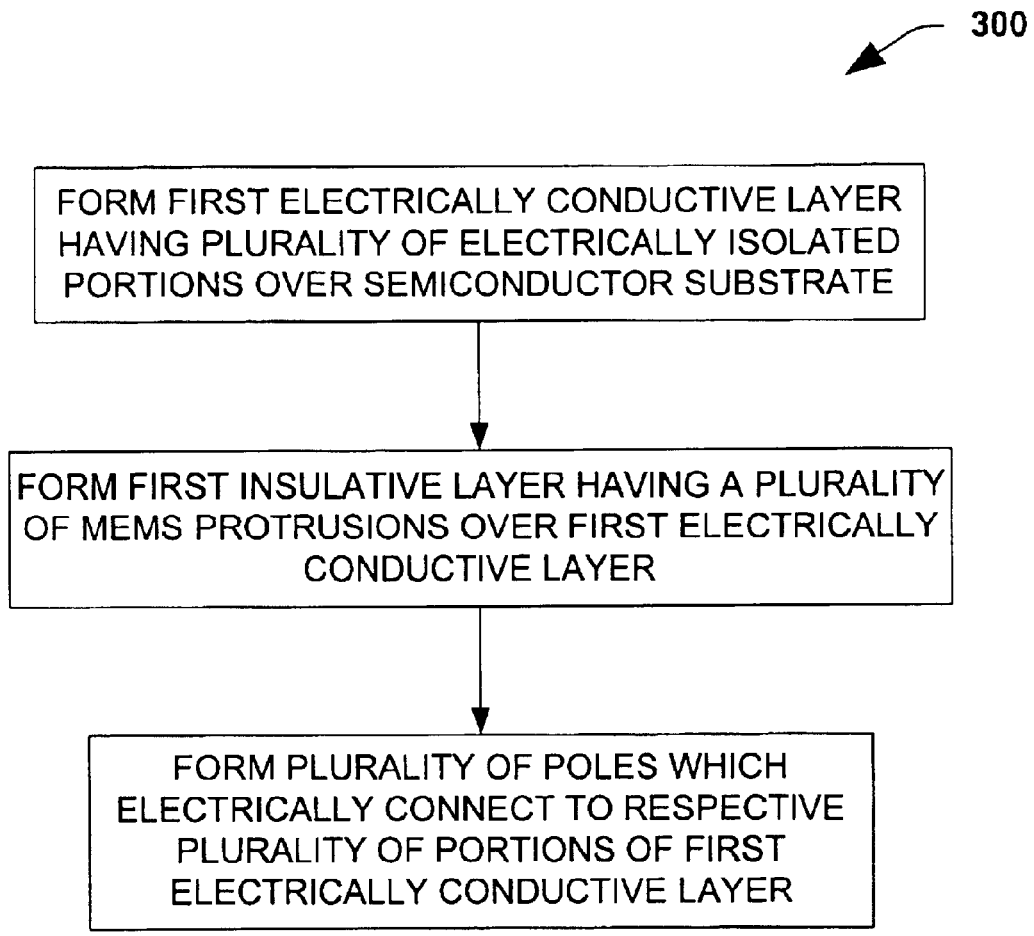
FIG. 16 is a flow chart diagram illustrating an exemplary methodology for forming a semiconductor-based electrostatic chuck according to the present invention.

Referring now to FIG. 16, a method 300 of forming a clamping plate for a MEMS-based multi-polar electrostatic chuck is illustrated, wherein the clamping plate comprises a semiconductor platform. Beginning with act 301, a first electrically conductive layer is formed over the semiconductor platform, wherein the first electrically conductive layer comprises a plurality of portions electrically isolated from one another. The first electrically conductive layer, for example, is formed over a top surface of the semiconductor platform, and a first electrically insulative layer is formed thereover in act 302. The first electrically insulative layer, for example, comprises a top surface having a plurality of MEMS protrusions extending a first distance therefrom, as discussed above. In act 303, a plurality of poles are electrically connected to the respective plurality of portions of the first electrically conductive layer, wherein a voltage applied between the plurality of poles is operable to generally induce an electrostatic force between a substrate residing on the plurality of protrusions and the clamping plate, therein maintaining a position of the substrate with respect to the ESC.

Figure 17:
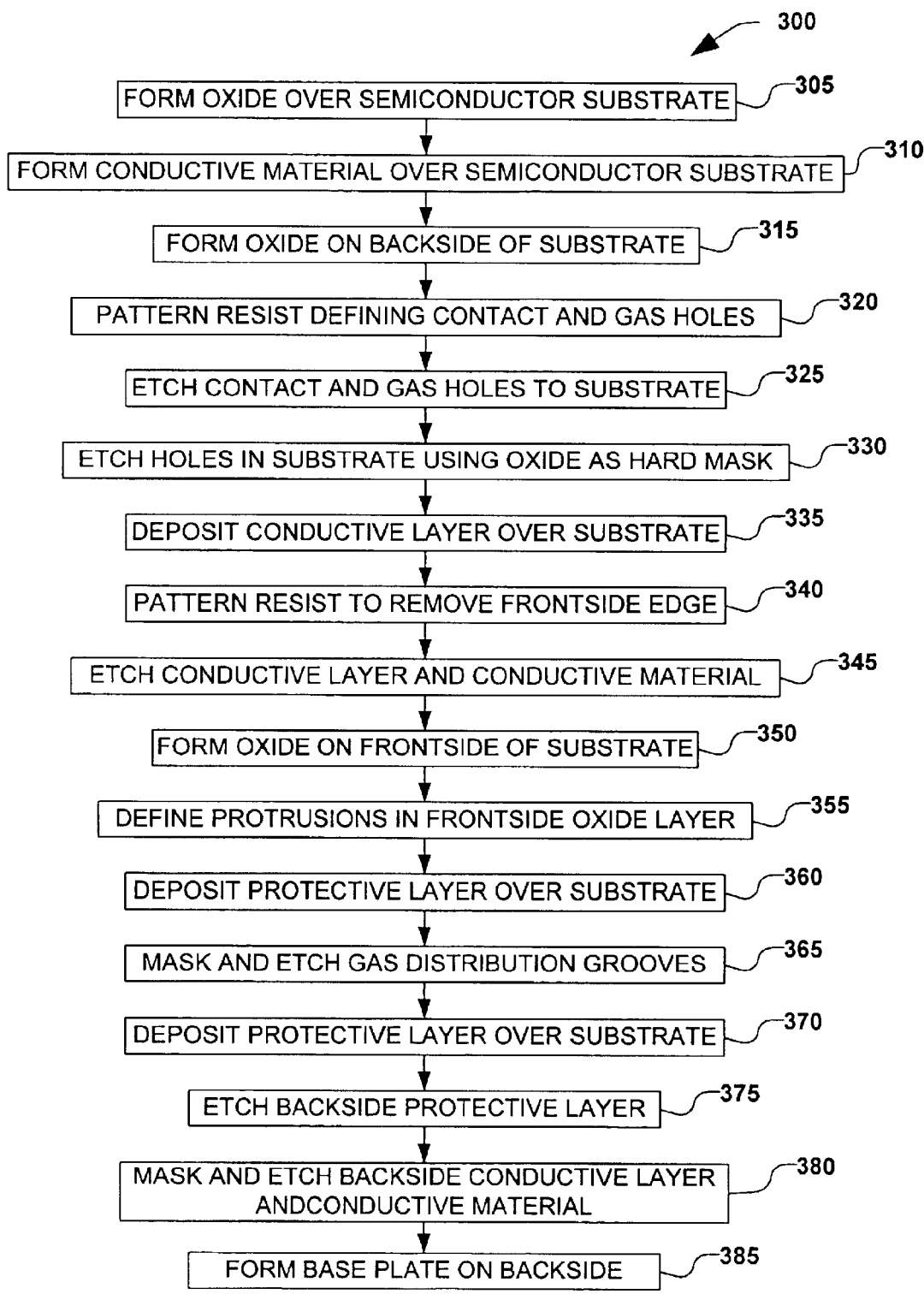
FIG. 17 is a flow chart diagram illustrating an exemplary methodology for forming a semiconductor-based electrostatic chuck according to another exemplary aspect of the present invention.
Figure 18A:
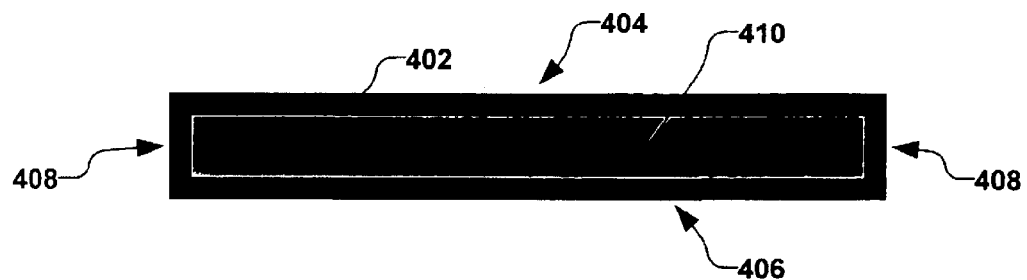
FIGS. 18A–18U illustrate partial cross-sectional views of a simplified electrostatic chuck as formed by the method of FIG. 17 according to the present invention.
Figure 18B:
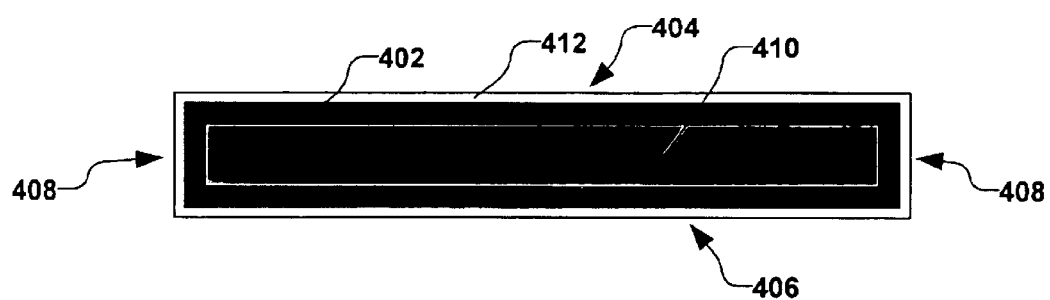
Figure 18C:
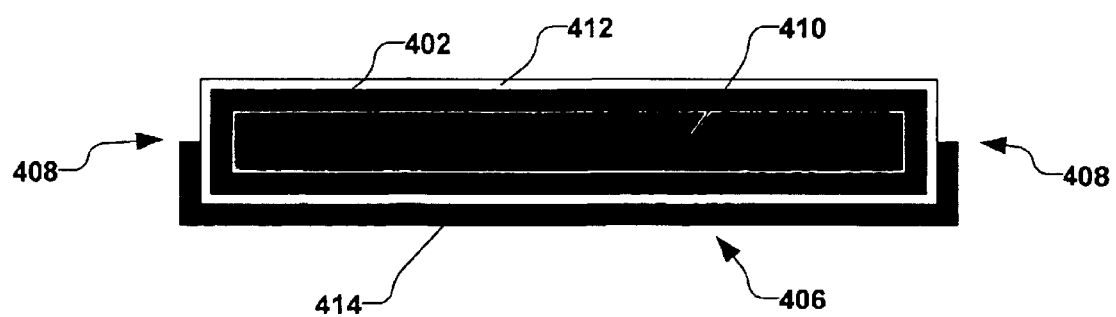
Figure 18D:
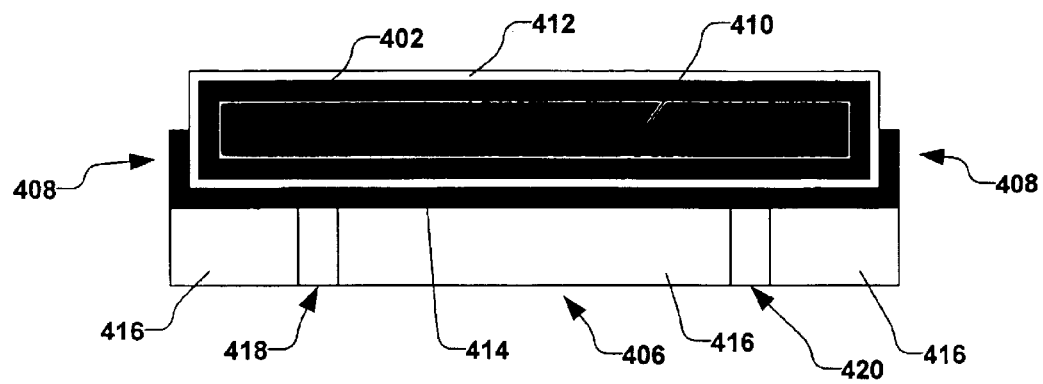
Figure 18E:
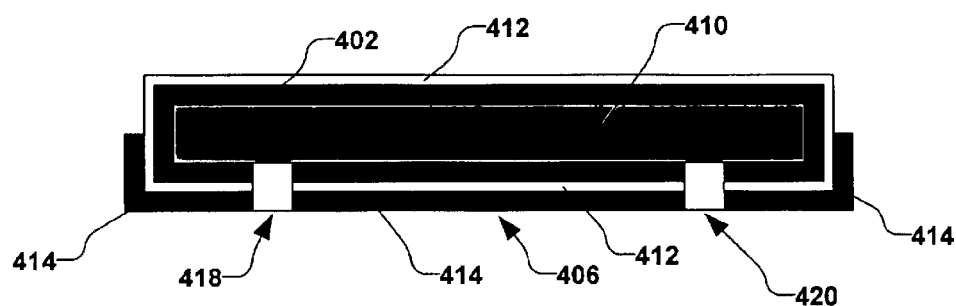
Figure 18F:
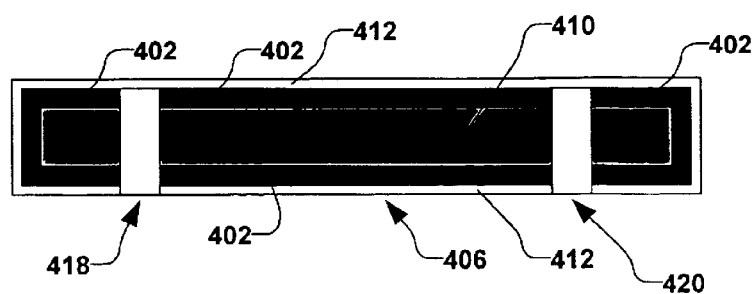
Figure 18G:
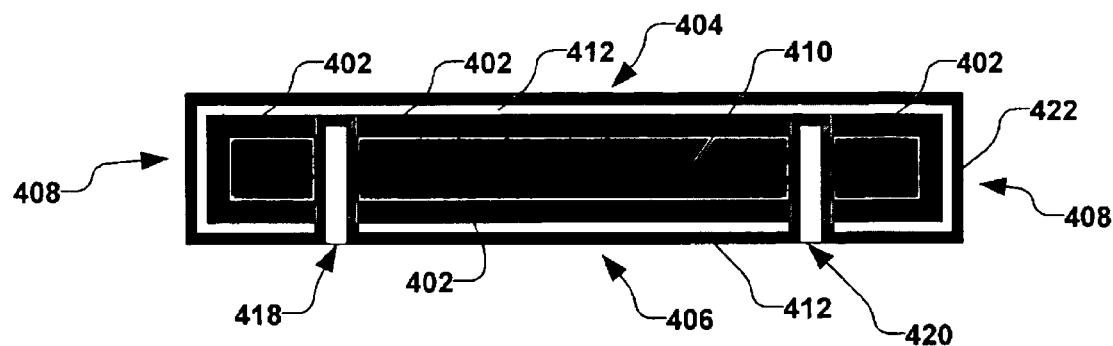
Figure 18H:
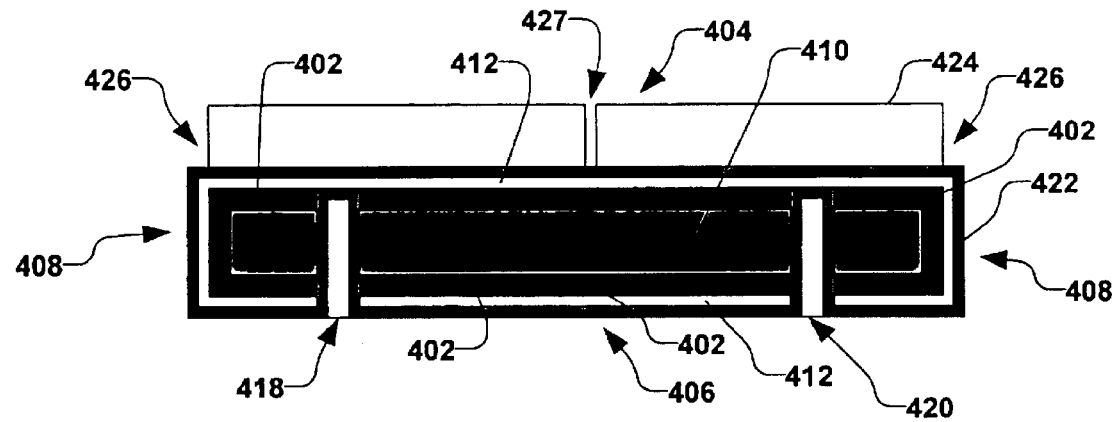
Figure 18I:
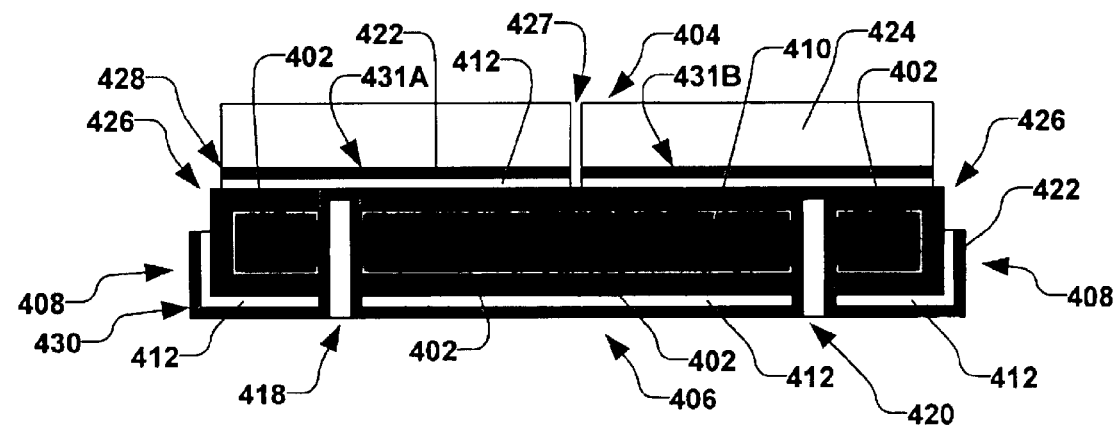
Figure 18J:
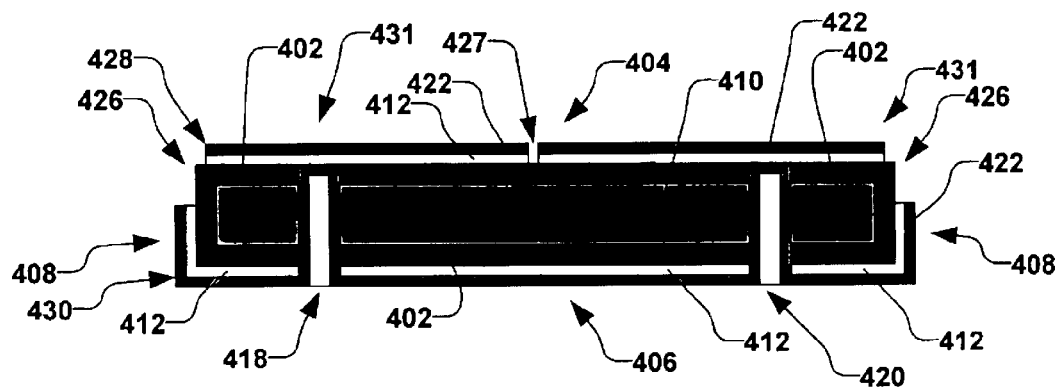
Figure 18K:
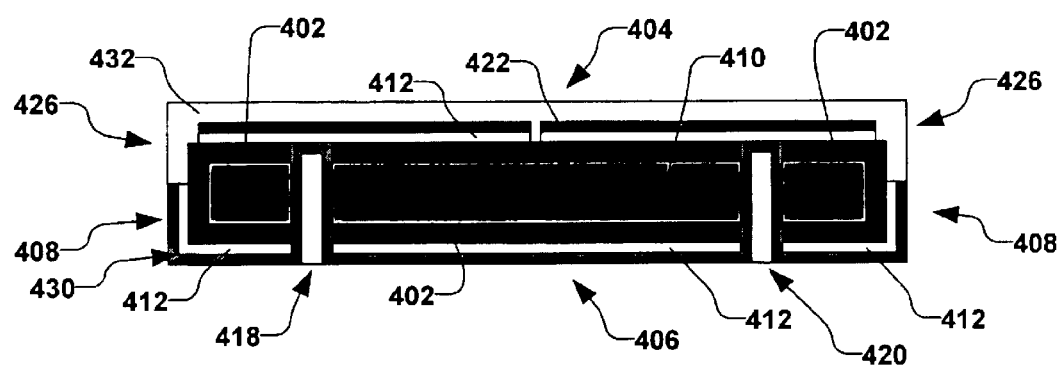
Figure 18L:
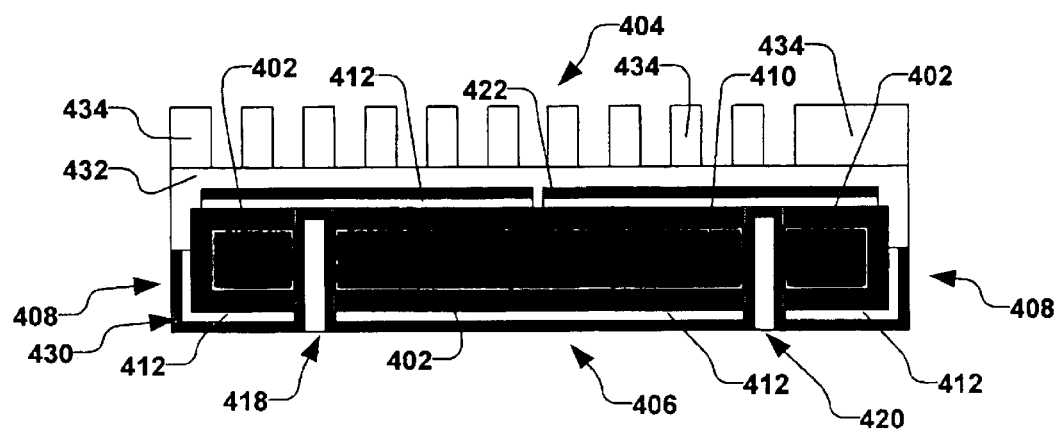
Figure 18M:
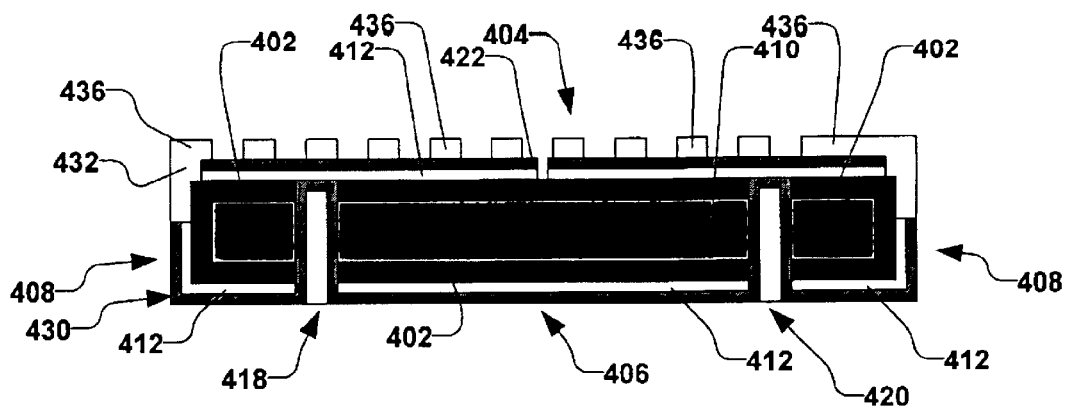
Figure 18N:
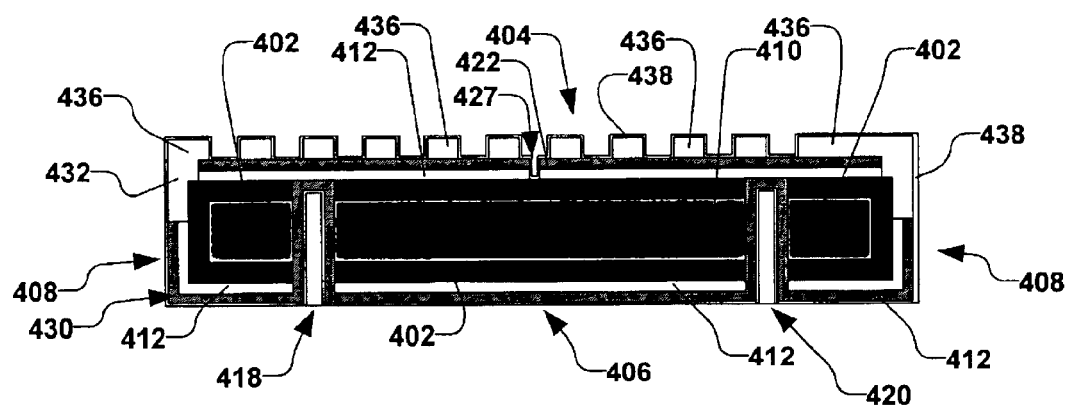
Figure 18O:
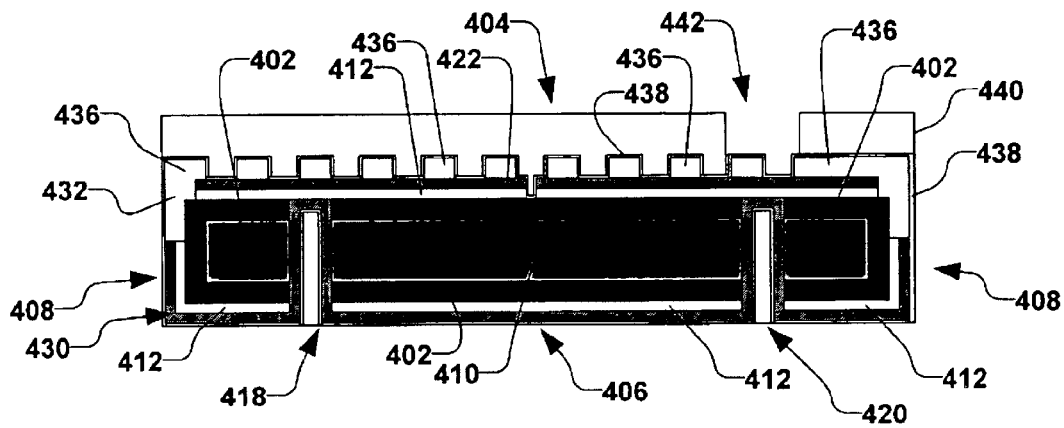
Figure 18P:
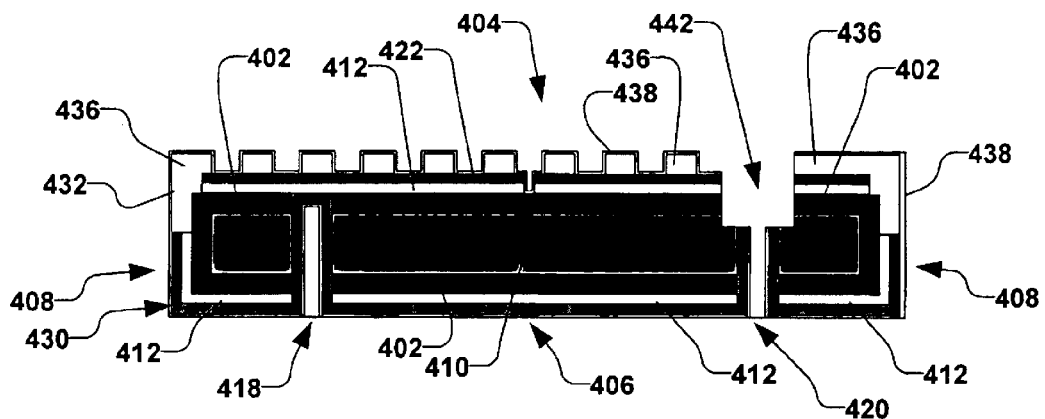
Figure 18Q:
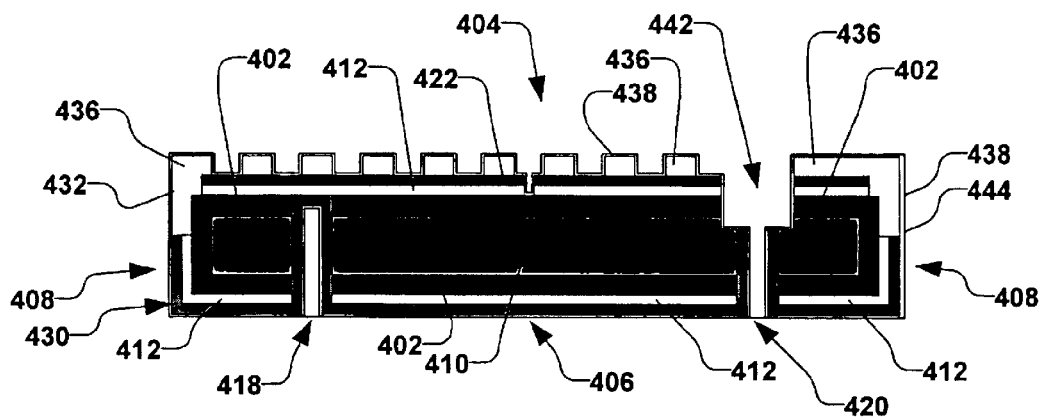
Figure 18R:
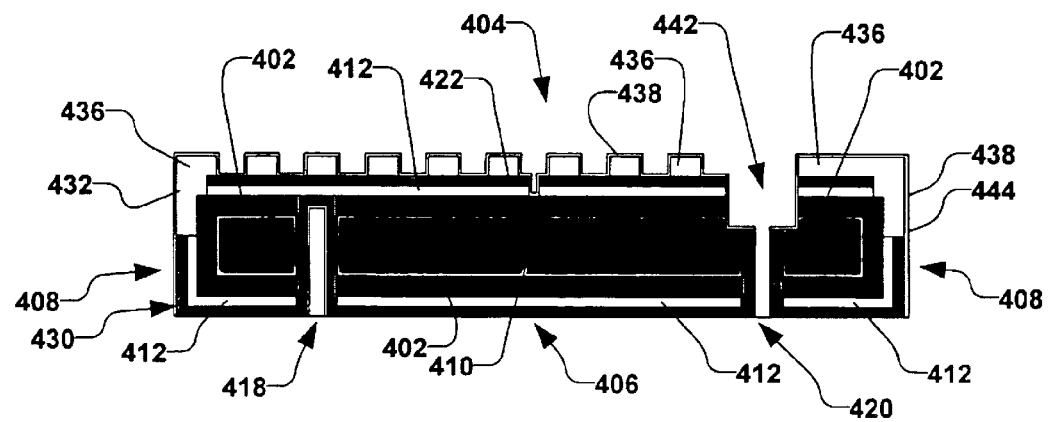
Figure 18S:
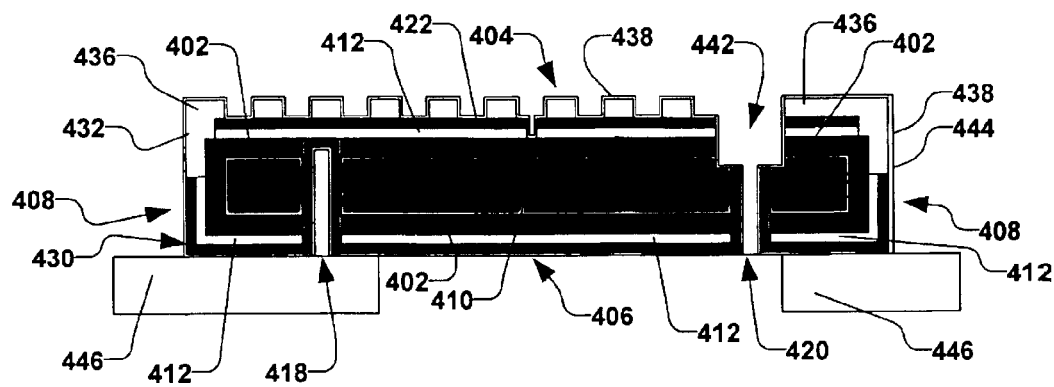

As illustrated in FIG. 17, the method 300 of FIG. 16 is further illustrated according to one exemplary aspect of the invention, wherein the method can be further illustrated with reference to FIGS. 18A–18S. Beginning with act 305 of FIG. 17, for example, an oxide is formed over a semiconductor substrate, such as a silicon semiconductor platform. As illustrated in FIG. 18A, the oxide layer 402, for example, is formed over a frontside 404, a backside 406, and a sidewall 408 of the semiconductor substrate 410 (e.g., a 2 micron $SiO_2$ layer grown over a double-polished 300 mm silicon wafer). In act 310 of FIG. 17, a conductive layer (e.g., a poly film) is formed over the substrate. For example, as illustrated in FIG. 18B, the poly film 412 comprises a doped poly-silicon film of approximately 1 micron formed over the frontside 404, backside 406, and sidewall 408 of the substrate 410, wherein the poly film is generally electrically conductive. In act 315 of FIG. 17, an oxide layer is formed on the backside of the substrate, as further illustrated in FIG. 18C. The oxide 414, for example, comprises a 2 micron deposition of $SiO_2$, wherein the oxide 414 covers the backside 406 of the substrate 410, as well as partially covering the sidewall 408 of the substrate.

Referring again to FIG. 17, act 320 comprises patterning a resist layer to define contact holes, and optionally, gas holes. FIG. 18D illustrates the resist 416 is patterned over the backside 406 of the substrate 410, wherein the resist generally defines a contact hole 418 and a gas hole 420. Note that the number of contact holes 418 and gas holes 420 illustrated in the figures is shown for simplicity, and numerous contact holes and gas holes may be defined. Alternatively, no gas holes 420 may be formed, such as when the ESC is utilized in contact conductivity applications, as described above. The contact hole 418, for example, is utilized to define a frontside contact (not illustrated in FIG. 18D), as will be discussed hereafter. In act 325 of FIG. 17, the contact hole and gas hole are etched using the patterned resist as a mask, and FIG. 18E illustrates the result, wherein the oxide layers 402 and 414 and the poly film 412 are etched to the substrate 410, therein further defining the contact hole 418 and gas hole 420. The resist is subsequently stripped, and in act 330 of FIG. 17, the contact hole and gas hole are further etched in the substrate, using the oxide layer 414, for example, as a hard mask which is further removed in the process of etching the substrate. FIG. 18F illustrates the result of act 330, wherein the substrate 410 is etched, and wherein the oxide layers 402 and 414 are further etched, using the poly film 412 as an etch stop. The oxide layers 402 and 414, can be etched using, for example, a wet etch or a reactive ion etch (RIE) process.

Act 335 of FIG. 17 illustrates a deposition of a conductive layer over the substrate. FIG. 18G illustrates the result of act 335, wherein the conductive layer 422 is deposited over the substrate 410 (e.g., a chemical vapor deposition (CVD) of 0.1 micron of $WSi_2$), including the frontside 404, backside 406, and sidewall 408 of the substrate, as well as inside of the contact hole 418 and gas hole 420. The conductive layer 422 formed in act 335 of FIG. 17, for example, may comprise one or more of the first electrically conductive layer 125, the second electrically conductive layer 165, or the third electrically conductive layer 194, as illustrated in FIGS. 2, 13, and 14.

In act 340 of FIG. 17, a photoresist is patterned over the frontside of the substrate for removing a frontside edge of the conductive layer. The photoresist formed in act 340 may further be utilized to define the plurality of portions of the first electrically conductive layer, as will be illustrated hereafter. FIG. 18H illustrates the photoresist 424 formed over the frontside 404 of the substrate 410, wherein the frontside edge 426 is not covered by the photoresist. Optionally, an isolator region 427 is also defined, wherein the isolator region will be utilized in defining the plurality of portions (not shown) of the first electrically conductive layer (not shown). In act 345 of FIG. 17, the conductive layer and poly film are etched, using the patterned resist as a mask. FIG. 18I illustrates the result of performing act 345, wherein the frontside edge 426 is generally etched, and wherein the conductive layer 422 and poly film 412 are generally removed along the frontside edge 426. According to one exemplary aspect of the invention, the first electrically conductive layer 428 from the second electrically conductive layer 430 generally comprise the poly film 412 and the conductive layer 422, wherein the first electrically conductive layer and the second electrically conductive layer are generally electrically isolated from one another in act 345. FIG. 18J illustrates the first electrically conductive layer 428 and second electrically conductive layer 430 after the photoresist is removed, and wherein the isolator region 427 further electrically isolates the plurality of portions 431 of the first electrically conductive layer.

Act 350 of FIG. 17 illustrates the act of forming a frontside oxide over the frontside of the substrate. FIG. 18K illustrates the frontside oxide layer 432 formed over the frontside 404 of the substrate 410, wherein the frontside oxide generally covers the first electrically conductive layer 428 and further generally covers the frontside edge 426. The first electrically insulative layer illustrated in act 302 of FIG. 16, for example, comprises the frontside oxide 432 of FIG. 18K. In act 355 of FIG. 17, a plurality of MEMS protrusions are formed in the frontside oxide layer. FIGS. 18L–18M illustrate the formation of the plurality of protrusions. In FIG. 18L, a photoresist 434 is deposited and patterned over the frontside oxide layer 432, and the frontside oxide layer is subsequently etched, wherein the plurality of protrusions 436 of FIG. 18M are generally defined after removal of the photoresist 434. Referring again to FIG. 17, act 360 illustrates a deposition of a protective layer over the substrate. In FIG. 18N, the protective layer 438 is generally formed over the substrate 410, wherein the frontside 404, backside 406, and sidewall 408 of the substrate are generally covered by the protective layer, as well as within regions 418 and 420. The protective layer 438, for example, comprises a nitride (e.g., silicon nitride $Si_3N_4$) of approximately 0.1 microns which can be utilized as an etch stop in subsequent operations.

According to another exemplary aspect of the present invention, in act 365 of FIG. 17, one or more gas distribution grooves are masked and etched in the substrate. When contact conductivity through the ESC is desired, however, no gas distribution grooves may be formed, and the ESC may proceed to act 375, as will be discussed hereafter. However, when gas conductivity is desired, act 365 is performed, and FIG. 18O illustrates the patterning of a mask 440 formed over the frontside 404 of the substrate 410, wherein a gas distribution groove 442 is generally defined therein. It should be noted that the gas distribution groove 442 is illustrative, and only one groove is illustrated in the cross-sectional view; however more than one groove may be formed. For example, referring again to FIG. 9, one of the plurality of protrusions 436 comprises the ring 153, wherein the peripheral gas distribution groove 156 resides within the ring 153.

According to one example, referring again to FIG. 18O, a relatively thick hard mask 440 such as BSG is formed over the frontside 404 of the substrate, wherein the hard mask is generally easily etched, and wherein the etch is further selective to the protective layer 438 and the oxide layer 402 in the gas distribution groove 442. FIG. 18P illustrates the result of performing act 365, wherein the gas distribution groove 442 is generally etched to the substrate 410 (e.g., the substrate is further etched slightly). In act 370 of FIG. 17, another protective layer is formed over the substrate to protect the newly-formed gas distribution groove during operation of the ESC. FIG. 18Q illustrates the result of performing act 370, wherein the protective layer 444 generally covers the topside 404, the backside 406, the sidewall 408, the contact hole 418, the gas hole 420, and the gas distribution groove 442. The protective layer 444 comprises, for example, a 0.2 micron thick layer of silicon nitride.

Figure 18T:
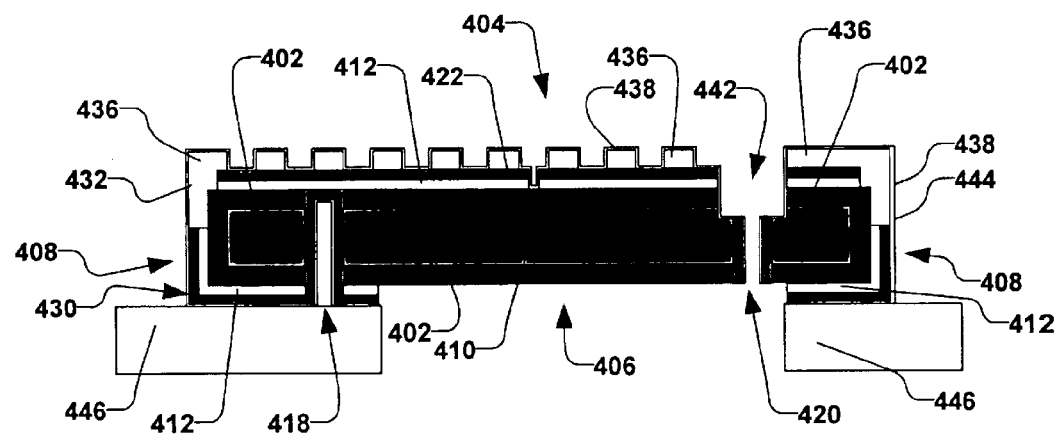

Referring again to FIG. 17, act 375 illustrates an etching of the protective layer on the backside of the substrate. FIG. 18R illustrates the result of performing act 375, wherein the protective layer 444 is generally removed from the backside 406 of the substrate 410. Such a removal of the protective layer 444 generally permits an electrical connection to the second electrically conductive layer 430. In act 380 of FIG. 17, the second electrically conductive layer is masked and etched to generally electrically isolate a plurality of portions of the second electrically conductive layer, further generally defining the poles of the electrostatic chuck. FIG. 18S illustrates the formation of the mask 446 over the backside 406 of the substrate 410. FIG. 18T illustrates the result of etching the second electrically conductive layer 430 and the poly film 412, wherein the plurality of poles 448 are electrically isolated from one another.

Figure 18U:
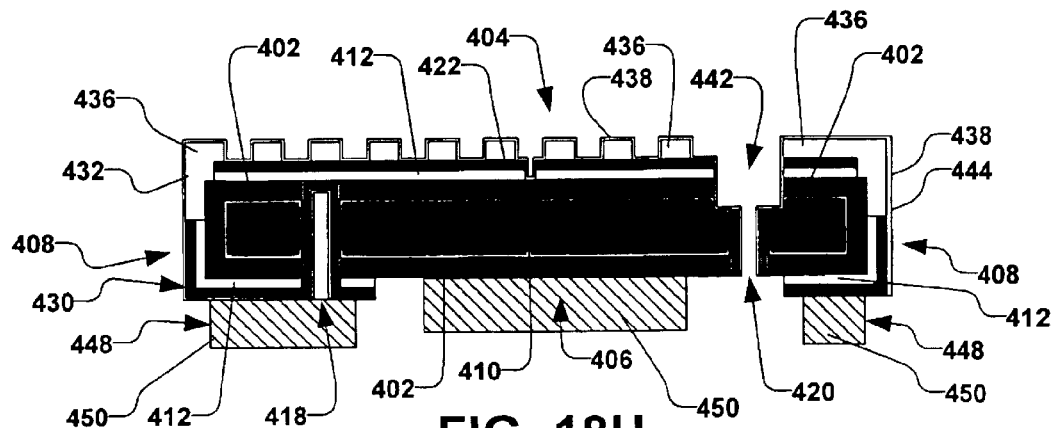

In act 385 of FIG. 17, a base plate is generally formed over the backside of the substrate, wherein the base plate is operable to generally transfer heat from the electrostatic chuck. FIG. 18U illustrates the result of performing act 385, wherein the base plate 450 is formed over the backside 406 of the substrate 410. For example, the base plate comprises aluminum which is evaporated onto the backside 406 though a ring mask (not shown) to protect the poly film 412. Alternatively, a base plate 450 comprising amorphous silicon may be electrically connected to the second electrically conductive layer 430 by brazing, wherein the base plate further comprises an oxide layer 192 and a third electrically conductive layer 194 formed thereon, as illustrated in FIG. 14, wherein the third electrically conductive layer is further etched to electrically isolate a plurality of portions thereof.

Figure 19:
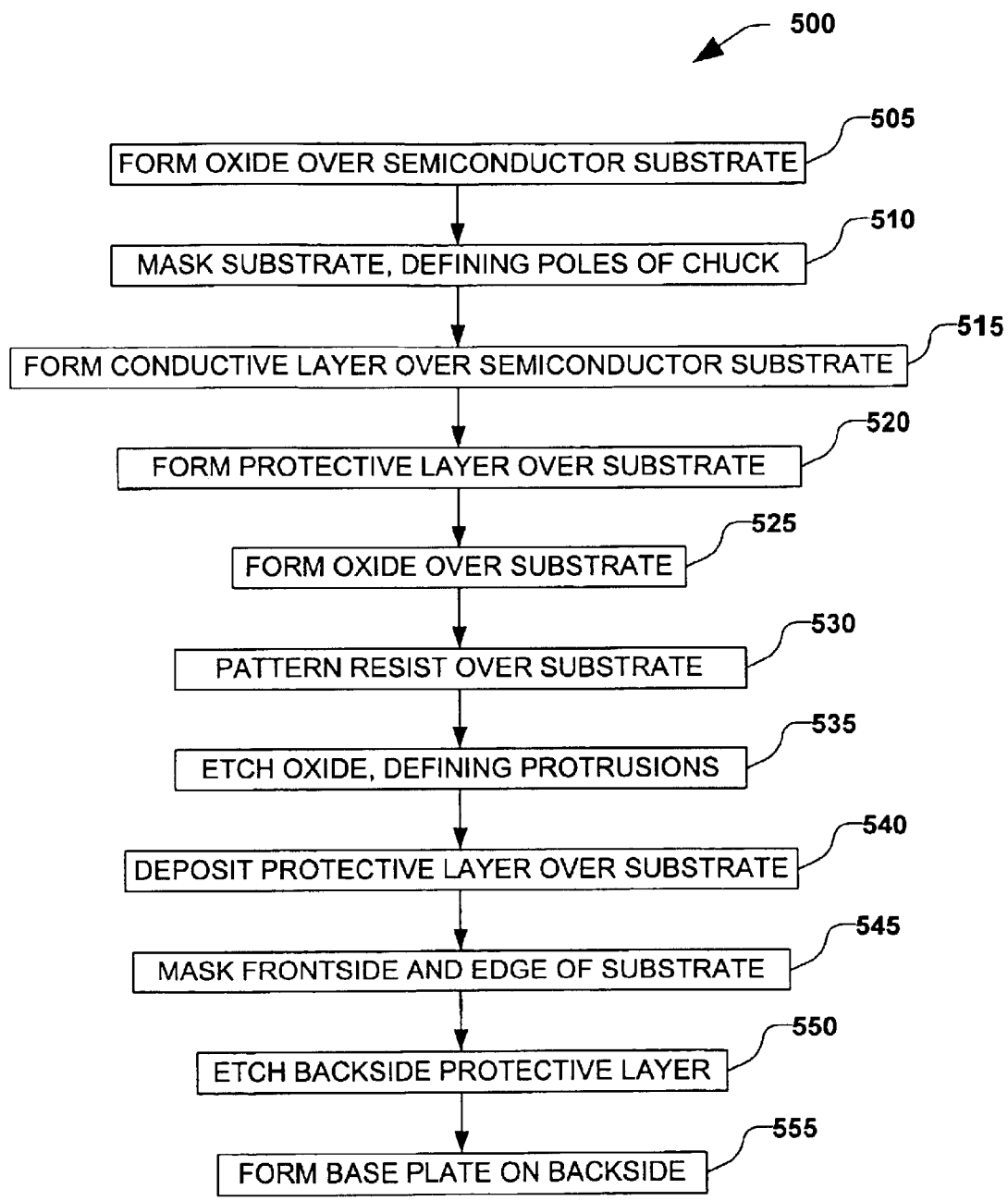
FIG. 19 is a flow chart diagram illustrating an exemplary methodology for forming a semiconductor-based electrostatic chuck according to yet another exemplary aspect of the present invention.
Figure 20A:
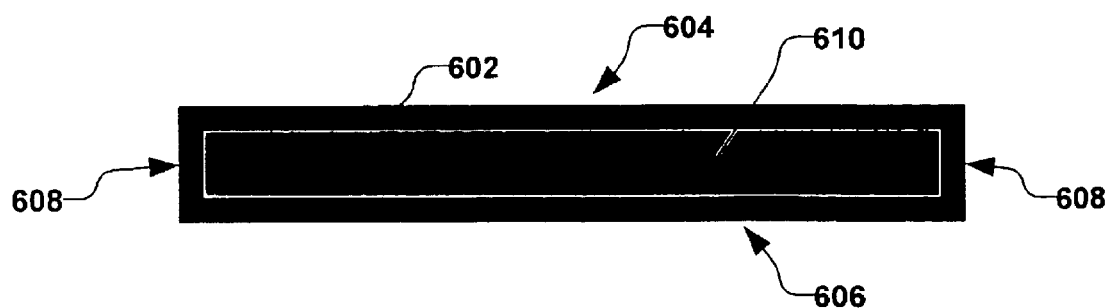
FIGS. 20A–20I illustrate partial cross-sectional views of a simplified electrostatic chuck as formed by the method of FIG. 19 according to the present invention.
Figure 20B:
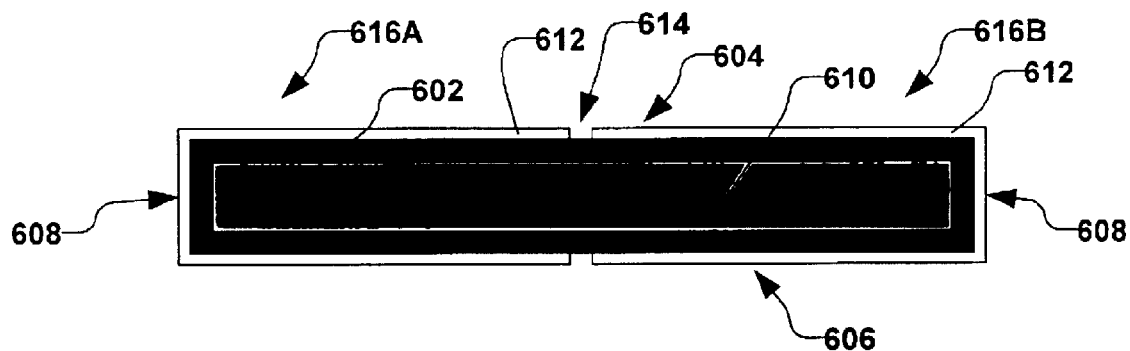

As illustrated in FIG. 19, the method 300 of FIG. 16 is further illustrated according to another exemplary aspect of the invention, wherein the method 500 of FIG. 19 can be further illustrated with reference to FIGS. 20A–20I. Beginning with act 505 of FIG. 19, for example, an oxide is formed over a semiconductor substrate, such as a silicon semiconductor platform. As illustrated in FIG. 20A, the oxide layer 602, for example, is formed over a frontside 604, a backside 606, and a sidewall 608 of the semiconductor platform or substrate 610 (e.g., a 2 micron $SiO_2$ layer grown over a double-polished 300 mm silicon wafer). In act 510 of FIG. 19, the substrate is masked, therein defining pole regions of the chuck on either side of a masked region. For example, the semiconductor platform is taped or otherwise masked in order to define the poles of the chuck. In act 515, a first conductive layer (e.g., a 0.1 micron Ti film) is formed over the substrate. For example, as illustrated in FIG. 20B, the first conductive layer 612 is formed (e.g., by CVD or PVD) over the frontside 604, backside 606, and sidewall 608 of the substrate 610, wherein the masked region 614 electrically isolates two or more pole regions 616A, 616B.

Figure 20C:
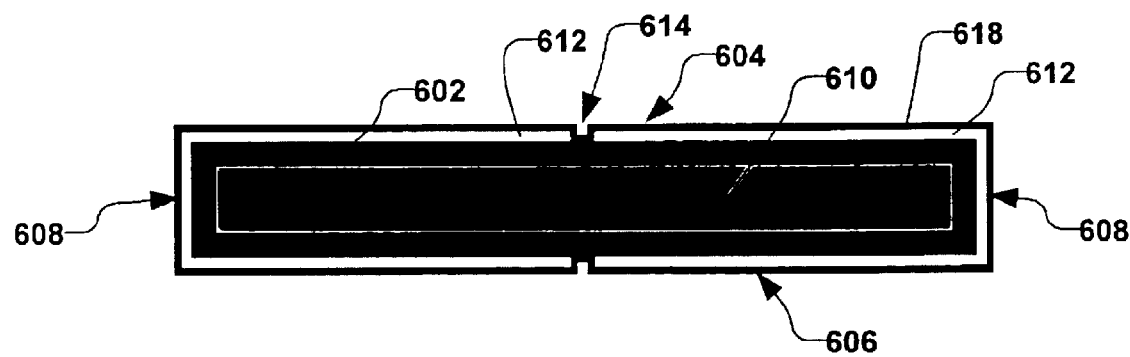
Figure 20D:
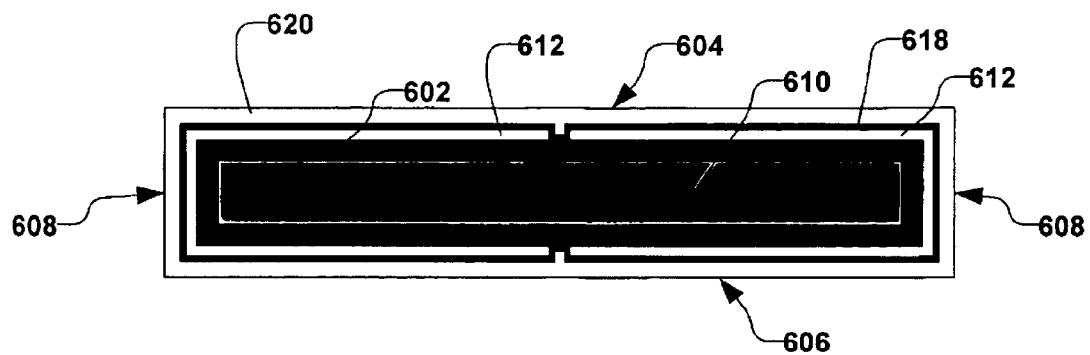
Figure 20E:
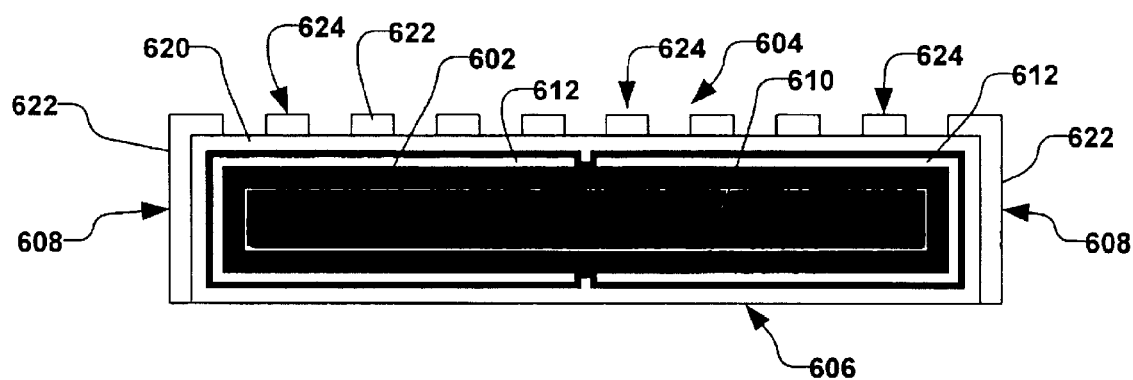

Referring again to FIG. 19, act 520 comprises forming a protective layer over the substrate, as further illustrated in FIG. 20C. The protective layer 618, for example, comprises a nitride layer formed over the frontside 604, backside 606, and sidewall 608 of the substrate 610 (e.g., a 500 Angstrom LPCVD of $Si_3N_4$). In act 525 of FIG. 19, a first electrically insulative layer is formed over the semiconductor platform, and the result of performing act 525 is illustrated in FIG. 20D. The first electrically insulative layer, for example, comprises a 2 micron deposition of an oxide 620 (e.g., a PETEOS of 1 micron of $SiO_2$ performed twice), wherein the oxide 620 further covers the frontside 604, backside 606, and sidewall 608 of the substrate 610. Act 530 of FIG. 19 further describes patterning a photoresist over the substrate, wherein a plurality of protrusion regions are defined. For example, FIG. 20E illustrates the photoresist 622 is patterned over the frontside 604 and sidewalls 608 of the substrate 610, therein defining the plurality of protrusion regions 624. The backside 606 of the substrate 610, for example, is further left exposed in the patterning of the resist 622.

Figure 20F:
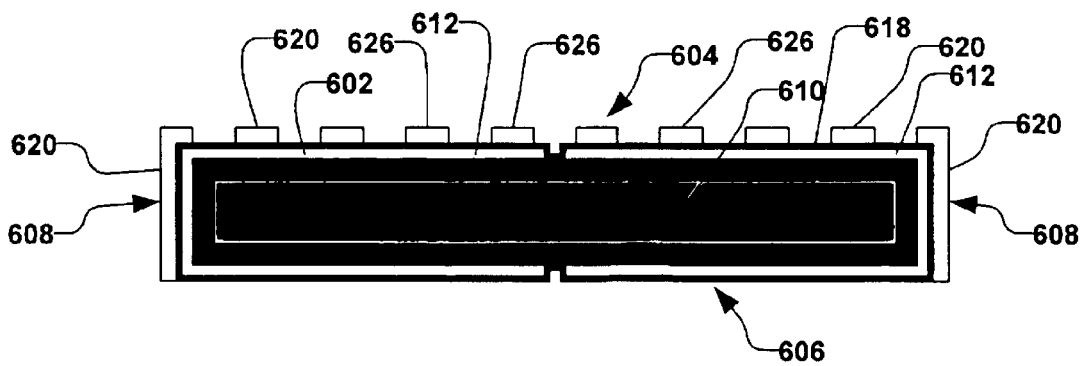
Figure 20G:
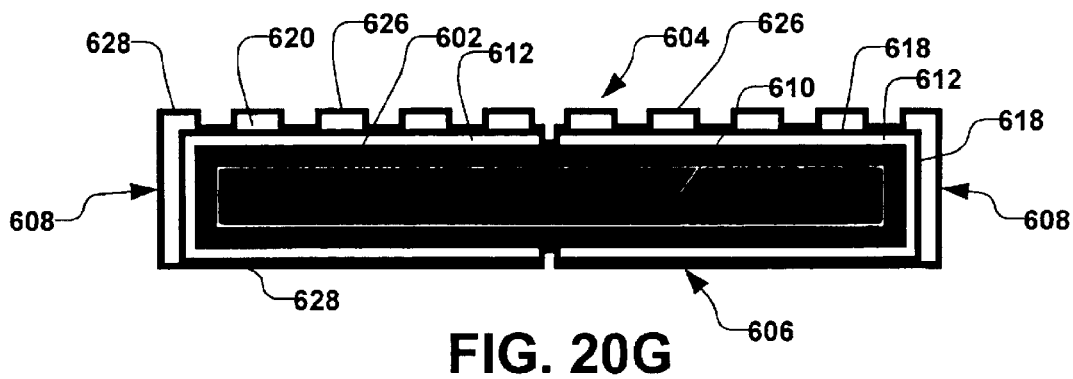

Act 535 of FIG. 19 illustrates an etch of the first electrically insulative layer, wherein a plurality of protrusions are generally defined. In act 535, for example, the first electrically insulative layer is also removed from the backside of the substrate. FIG. 20F illustrates the plurality of protrusions 626 which have been defined by the etching (e.g., wet etching) the oxide layer 620, wherein the protective layer 618 is utilized as an etch stop. The backside 606 of the substrate 610 has further been etched, thus removing the oxide 620 from the backside of the substrate. In act 540 of FIG. 19, another protective layer is formed over the substrate. FIG. 20G illustrates the protective layer 628 which has been formed (e.g., a 500 Angstrom layer of $Si_3N_4$ formed by LPCVD) over the frontside 604, backside 606, and sidewall 608 of the substrate 610.

Figure 20H:
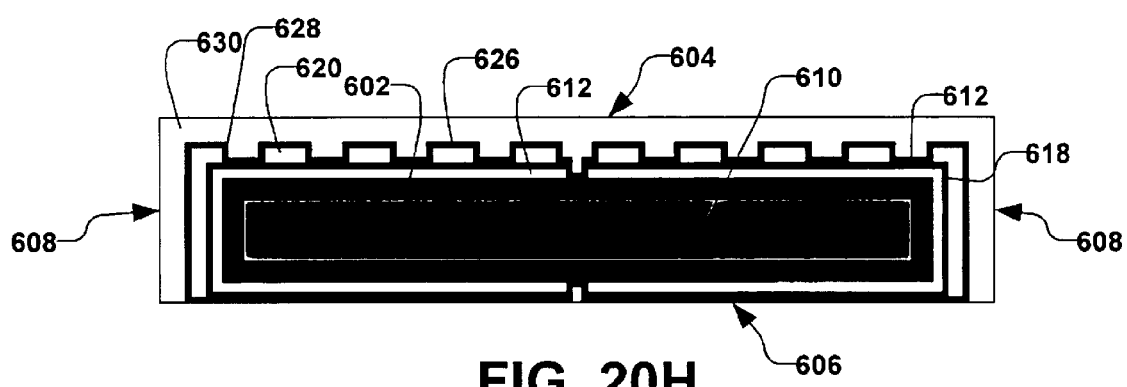
Figure 20I:
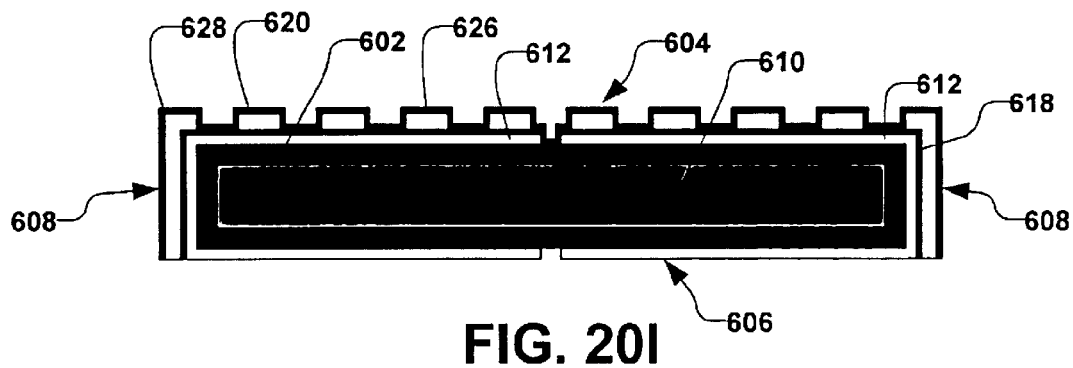
Figure 21:
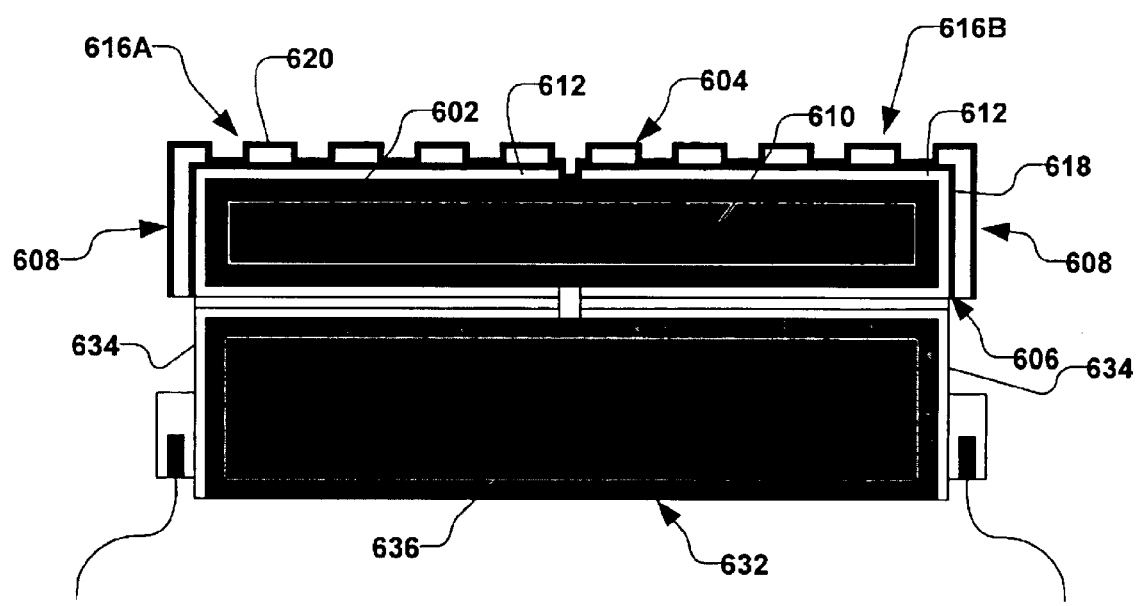
FIG. 21 illustrates a plan view of an exemplary electrostatic chuck which has been formed according to the one aspect of the present invention.

In act 545 of FIG. 19, the frontside and sidewall edge of the substrate are masked, thereby leaving the backside of the substrate exposed. FIG. 20H illustrates the mask 630 covering the frontside 604 and sidewall 608 of the substrate 610, leaving the backside 606 exposed. The protective layers 628 and 618 are subsequently etched (e.g., a plasma etch) in act 550 of FIG. 19, and FIG. 20I illustrates the result, wherein the protective layers 628 and 618 are generally removed from the first electrically conductive layer 612 over the backside 606 of the substrate 610. Referring again to FIG. 19, a base plate is formed on the backside of the substrate in act 555, and FIG. 21 illustrates an exemplary result of forming the base plate 632 over the backside 606 of the substrate 610. The base plate 632 is electrically connected to the two or more pole regions 616A and 616B through the first electrically conductive layer 612. For example, the base plate 632 comprises a conductive material 634 formed over an amorphous silicon base 636, wherein the conductive material comprises a plurality of portions electrically isolated from one another which are further vacuum brazed to the first electrically conductive layer 612 in a manner similar to that discussed above.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a clamping plate for a multi-polar electrostatic chuck, comprising:
    forming a first electrically conductive layer over a semiconductor platform and defining a plurality of portions of the first electrically conductive layer which are electrically isolated from one another;
    forming a first electrically insulative layer over the first electrically conductive layer, the first electrically insulative layer comprising a top surface having a plurality of MEMS protrusions extending a first distance therefrom; and
    forming a plurality of poles electrically connected to the respective plurality of portions of the first electrically conductive layer, wherein a voltage applied between the plurality of poles is operable to induce an electrostatic force in the clamping plate.

2. The method of claim 1, wherein forming the first electrically conductive layer comprises forming a polysilicon layer over the semiconductor platform.

3. The method of claim 2, wherein forming the first electrically conductive layer further comprises forming a metal layer over the polysilicon layer.

4. The method of claim 1, wherein the first electrically conductive layer is formed over a top surface of the semiconductor platform, the method further comprising forming a second electrically conductive layer over a bottom surface of the semiconductor platform, wherein a plurality of portions of second electrically conductive layer are defined which are electrically insulated from one another.

5. The method of claim 4, wherein the first electrically conductive layer and the second electrically conductive layer are formed generally concurrently.

6. The method of claim 4, further comprising forming a plurality of vertical interconnects electrically connecting the plurality of portions of the first electrically conductive layer to the respective plurality of portions of the second electrically conductive layer.

7. The method of claim 6, wherein forming the plurality of vertical interconnects comprises forming a plurality of sidewall contacts over a sidewall of the semiconductor platform, wherein the plurality of sidewall contacts are electrically isolated from one another, and wherein the plurality of sidewall contacts electrically connect the respective plurality of portions of the first electrically conductive layer and the second electrically conductive layer.

8. The method of claim 7, wherein the forming the plurality of sidewall contacts comprises a deposition of an electrically conductive material over the sidewall of the semiconductor platform.

9. The method of claim 8, wherein the forming the plurality of sidewall contacts comprises depositing one or more of polysilicon, tungsten silicide, tungsten, or titanium.

10. The method of claim 7, wherein the formation of the first electrically conductive layer, the second electrically conductive layer, and the plurality of sidewall contacts are formed generally concurrently.

11. The method of claim 4, wherein forming the second electrically conductive layer comprises depositing one or more of tungsten silicide, tungsten, or titanium.

12. The method of claim 4, further comprising forming a base plate thermally coupled to the second electrically conductive layer, wherein the base plate is operable to transfer thermal energy from the semiconductor platform to the base plate.

13. The method of claim 12, wherein the forming the base plate comprises forming a third electrically conductive layer having a plurality of portions electrically isolated from one another thereon over the second electrically conductive layer, and electrically connecting the plurality of portions of the third electrically conductive layer to the respective plurality of portions of the second electrically conductive layer.

14. The method of claim 13, wherein forming the plurality of poles comprises bonding a plurality of electrodes to the respective plurality of portions of the third electrically conductive layer.

15. The method of claim 13, wherein the base plate comprises an amorphous silicon plate having an oxide layer formed thereover, wherein the third electrically conductive layer is formed over the oxide layer.

16. The method of claim 13, wherein forming the third electrically conductive layer comprises depositing one or more of tungsten silicide, tungsten, or titanium.

17. The method of claim 12, wherein forming the base plate comprises evaporating one or more metals onto the plurality of portions of the second electrically conductive layer.

18. The method of claim 12, wherein forming the base plate comprises vacuum brazing the base plate to the second electrically conductive layer.

19. The method of claim 12, wherein forming the base plate comprises applying an electrically conductive epoxy between the base plate and the second electrically conductive layer.

20. The method of claim 12, further comprising forming one or more fluid conduits through the base plate, wherein a cooling fluid is operable to flow therethrough.

21. The method of claim 12, further comprising forming a heat source within the base plate, wherein the heat source is operable to selectively heat the clamping plate.

22. The method of claim 1, wherein forming the first electrically conductive layer comprises depositing one or more of tungsten silicide, tungsten, or titanium.

23. The method of claim 1, wherein the semiconductor platform comprises a silicon substrate.

24. The method of claim 1, wherein the first electrically insulative layer is comprised of silicon dioxide.

25. The method of claim 1, further comprising forming one or more gas distribution grooves in the first electrically insulative layer, the first electrically conductive layer, and the semiconductor platform.

26. The method of claim 25, wherein forming the one or more gas distribution grooves comprises etching the first electrically insulative layer, the first electrically conductive layer, and the semiconductor platform.

27. The method of claim 25, further comprising forming one or more gas distribution holes through the semiconductor platform, the first electrically conductive layer, and the first electrically insulative layer, wherein at least one of the one or more gas distribution holes is formed through at least one of the one or more gas distribution grooves.

28. The method of claim 27, wherein forming the one or more gas distribution holes comprises a reactive ion etch of the first electrically insulative layer, the first electrically conductive layer, and the semiconductor platform.

29. The method of claim 1, wherein forming the plurality of MEMS protrusions further comprises:

forming a mask over the first electrically insulative layer, wherein the mask generally defines a plurality of valleys over the top surface of the semiconductor platform;

etching the first electrically insulative layer in the plurality of valleys; and removing the mask, therein defining the plurality of MEMS protrusions between the plurality of valleys.

30. The method of claim 29, wherein etching the first electrically insulative layer uses the first electrically conductive layer as an etch stop.

31. The method of claim 29, further comprising forming a protective layer over the semiconductor platform after the first electrically insulative layer is formed thereover, and wherein etching the first electrically insulative layer uses the protective layer as an etch stop.

32. The method of claim 31, wherein forming the protective layer comprises depositing a nitride layer over the first electrically conductive layer and the semiconductor platform.

33. The method of claim 31, further comprising removing the protective layer on a bottom surface of the semiconductor platform.

34. The method of claim 1, wherein forming the first electrically conductive layer comprises forming a polysilicon layer over the semiconductor substrate.

35. The method of claim 1, wherein the plurality of MEMS protrusions are formed such that a substrate is operable to contact the plurality of MEMS protrusions, therein defining a protrusion contact area, wherein a ratio of the protrusion contact area to a surface area of the substrate is between about 0.02 and 0.2.

36. The method of claim 35, wherein the ratio of the protrusion contact area to the surface area of the substrate is approximately 0.10.

37. The method of claim 1, wherein the first distance is approximately 1 micron.

38. The method of claim 1, further comprising forming a temperature sensor hole through the clamping plate, and inserting a temperature sensor into the temperature sensor hole.

39. The method of claim 1, wherein the semiconductor platform comprises a mosaic of a plurality of semiconductor segments.

40. The method of claim 39, wherein the mosaic of the plurality of semiconductor segments are comprised of doped silicon.

41. The method of claim 39, wherein forming the first electrically conductive layer over the semiconductor platform comprises forming the first electrically conductive layer over the plurality of semiconductor segments, wherein each of the plurality of portions of the first electrically conductive layer is formed over one or more of the plurality of semiconductor segments.

42. The method of claim 39, further comprising inserting an electrical insulator between each of the plurality of portions of the first electrically conductive layer formed over the plurality of semiconductor segments.

43. The method of claim 42, wherein the electrical insulator comprises a ceramic spacer.

44. The method of claim 1, further comprising forming a protective layer over the semiconductor platform after the first electrically insulative layer is formed thereover.

45. The method of claim 44, wherein forming the protective layer comprises depositing a nitride layer over the first electrically insulative layer and the semiconductor platform.

46. The method of claim 44, further comprising removing the protective layer on a bottom surface of the semiconductor platform.

47. The method of claim 1, wherein forming the first electrically conductive layer comprises a chemical vapor deposition of an electrically conductive material.

48. The method of claim 47, wherein forming the first electrically conductive layer comprises a chemical vapor deposition of tungsten silicide.

49. The method of claim 1, wherein the semiconductor platform comprises a silicon substrate having an oxide formed thereover.

* * * * *